(12) United States Patent
Pelssers et al.

(10) Patent No.: US 11,289,643 B2
(45) Date of Patent: Mar. 29, 2022

(54) ACTUATOR DEVICE AND METHOD

(71) Applicant: KONINKLIJKE PHILIPS N.V., Eindhoven (NL)

(72) Inventors: Eduard Gerard Marie Pelssers, Panningen (NL); Daan Anton Van Den Ende, Breda (NL); Mark Thomas Johnson, Arendonk (BE); Cornelis Petrus Hendriks, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 297 days.

(21) Appl. No.: 16/467,525

(22) PCT Filed: Dec. 6, 2017

(86) PCT No.: PCT/EP2017/081616
§ 371 (c)(1),
(2) Date: Jun. 7, 2019

(87) PCT Pub. No.: WO2018/104357
PCT Pub. Date: Jun. 14, 2018

(65) Prior Publication Data
US 2019/0326505 A1 Oct. 24, 2019

(30) Foreign Application Priority Data
Dec. 9, 2016 (EP) .................... 16203279

(51) Int. Cl.
*H01L 41/06* (2006.01)
*H01L 41/18* (2006.01)
(Continued)

(52) U.S. Cl.
CPC .......... *H01L 41/183* (2013.01); *H01L 41/042* (2013.01); *H01L 41/06* (2013.01);
(Continued)

(58) Field of Classification Search
CPC ..... H01L 41/183; H01L 41/042; H01L 41/06; H01L 41/083; H01L 41/0926;
(Continued)

(56) References Cited

U.S. PATENT DOCUMENTS 8,847,855 B2  9/2014  Daniel et al.
2004/0130238 A1  7/2004  Dukart et al.
(Continued)

FOREIGN PATENT DOCUMENTS

DE   102011010757 A1   8/2012
JP   2000038643 A      2/2000
(Continued)

OTHER PUBLICATIONS

Karat Petcharoen et al: "Dual responses of magnetite-graphene hybrid in Polyurethane under magnetic and electric stimuli", Sensors and Actuators A: Physical, vol. 251, Nov. 1, 2016 (Nov. 1, 2016), pp. 26-34.
(Continued)

*Primary Examiner* — Terrance L Kenerly
(74) *Attorney, Agent, or Firm* — Schott, P.C.

(57) ABSTRACT

The invention relates generally to electroactive material actuators (and combined sensor-actuators) having embedded magnetic particles (42) for facilitating enhanced actuation and/or sensing effects.

15 Claims, 9 Drawing Sheets

(51) Int. Cl.
| | |
|---|---|
| *H01L 41/04* | (2006.01) |
| *H01L 41/083* | (2006.01) |
| *H01L 41/09* | (2006.01) |
| *H01L 41/113* | (2006.01) |
| *H01L 41/12* | (2006.01) |
| *H01L 41/193* | (2006.01) |
| *H01L 41/20* | (2006.01) |

(52) U.S. Cl.
CPC ........ *H01L 41/083* (2013.01); *H01L 41/0926* (2013.01); *H01L 41/0986* (2013.01); *H01L 41/1132* (2013.01); *H01L 41/125* (2013.01); *H01L 41/193* (2013.01); *H01L 41/20* (2013.01)

(58) Field of Classification Search
CPC . H01L 41/1132; H01L 41/125; H01L 41/193; H01L 41/20
USPC .......................................................... 310/26
See application file for complete search history.

(56) References Cited

U.S. PATENT DOCUMENTS

| | | |
|---|---|---|
| 2008/0170936 A1 | 7/2008 | Den Toonder et al. |
| 2009/0165877 A1 | 7/2009 | Den Toonder et al. |
| 2010/0016728 A1 | 1/2010 | Dietz et al. |
| 2010/0183456 A1 | 7/2010 | Toonder et al. |
| 2014/0356228 A1 | 12/2014 | Kim et al. |
| 2015/0315687 A1 | 11/2015 | Poole et al. |

FOREIGN PATENT DOCUMENTS

| | | |
|---|---|---|
| JP | 2010-500182 A | 1/2010 |
| JP | 2011-528269 A | 11/2011 |
| JP | 5667422 B2 | 2/2015 |
| JP | 2017-510643 | 7/2017 |
| RU | 2230353 C1 | 6/2004 |
| WO | 2010/018883 A1 | 2/2010 |

OTHER PUBLICATIONS

Petcharoen Karat et al: "Magneto-electro-responsive material based on magnetite nanoparticles/polyurethane composites", Materials Science and Engineering C,Elsevier Science S.A, CH, vol. 61, Dec. 12, 2015 (Dec. 12, 2015),pp. 312-323.

Guy0mar D et al: "Magnetoelectricity in Polyurethane films loaded with different magnetic particles", Materials Letters, Elsevier, Amsterdam, NL,vol. 63, No. 6-7,Mar. 15, 2009 (Mar. 15, 2009), pp. 611-613.

International Search Report dated Mar. 1, 2018.

Carlos Guerrero-Sanchez "Magnetorheological solid composites based on ionic liquids" Behavior and Mechanics of Multifunctional Materials and Composites 2009, edited by Zoubeida Ounaies, Jiangyu Li, Proc. of SPIE vol. 7289, 72891U • © 2009 SPIE • CCC code: 0277-786X/09/$18 • doi: 10.1117/12.815369 Proc. of SPIE vol. 7289 72891U-1.

ACTUATOR DEVICE AND METHOD

CROSS-REFERENCE TO PRIOR APPLICATIONS

This application is the U.S. National Phase application under 35 U.S.C. § 371 of International Application No. PCT/EP2017/081616, filed on Dec. 6, 2017, which claims the benefit of EP Patent Application No. EP 16203279.1, filed on Dec. 9, 2016. These applications are hereby incorporated by reference herein.

FIELD OF THE INVENTION

This invention relates to an actuator device, in particular an actuator device comprising an electroactive material.

B(2)ACKGROUND OF THE INVENTION

Electroactive materials (EAMs), and in particular electroactive polymers (EAPs) are an emerging class of materials within the field of electrically responsive materials. EAPs can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP materials give rise to applicability to new applications.

An EAP device can be used in any application in which a small amount of movement of a component or feature is desired, based on electric actuation. Similarly, the technology can be used for sensing small movements.

The use of EAPs enables functions which were not possible before, or offers a significant advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-1 MHz, most typically below 20 kHz.

Devices using electroactive polymers can be subdivided into field-driven and ionic-driven materials.

Examples of field-driven EAPs include Piezoelectric polymers, Electrostrictive polymers (such as PVDF based relaxor polymers) and Dielectric Elastomers. Other examples include Electrostrictive Graft polymers, Electrostrictive paper, Electrets, Electroviscoelastic Elastomers and Liquid Crystal Elastomers.

Examples of ionic-driven EAPs are conjugated/conducting polymers, Ionic Polymer Metal Composites (IPMC) and carbon nanotubes (CNTs). Other examples include ionic polymer gels.

Field-driven EAPs are actuated by an electric field through direct electromechanical coupling. They usually require high fields (tens of mega volts per meter) but low currents. Polymer layers are usually thin to keep the driving voltage as low as possible.

Ionic EAPs are activated by an electrically induced transport of ions and/or solvent. They usually require low voltages but high currents. They require a liquid/gel electrolyte medium (although some material systems can also operate using solid electrolytes).

Both classes of EAP have multiple family members, each having their own advantages and disadvantages.

A first notable subclass of field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of field driven EAPs is that of Dielectric Elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

A first notable subclass of ionic EAPs is Ionic Polymer Metal Composites (IPMCs). IPMCs consist of a solvent swollen ion-exchange polymer membrane laminated between two thin metal or carbon based electrodes and requires the use of an electrolyte. Typical electrode materials are Pt, Gd, CNTs, CPs, Pd. Typical electrolytes are Li+ and Na+ water-based solutions. When a field is applied, cations typically travel to the cathode side together with water. This leads to reorganization of hydrophilic clusters and to polymer expansion. Strain in the cathode area leads to stress in rest of the polymer matrix resulting in bending towards the anode. Reversing the applied voltage inverts bending. Well known polymer membranes are Nafion® and Flemion®.

Another notable subclass of Ionic polymers is conjugated/conducting polymers. A conjugated polymer actuator typically consists of an electrolyte sandwiched by two layers of the conjugated polymer. The electrolyte is used to change oxidation state. When a potential is applied to the polymer through the electrolyte, electrons are added to or removed from the polymer, driving oxidation and reduction. Reduction results in contraction, oxidation in expansion.

In some cases, thin film electrodes are added when the polymer itself lacks sufficient conductivity (dimension-wise). The electrolyte can be a liquid, a gel or a solid material (i.e. complex of high molecular weight polymers and metal salts). Most common conjugated polymers are polypyrrole (PPy), Polyaniline (PANi) and polythiophene (PTh).

An actuator may also be formed of carbon nanotubes (CNTs), suspended in an electrolyte. The electrolyte forms a double layer with the nanotubes, allowing injection of charges. This double-layer charge injection is considered as the primary mechanism in CNT actuators. The CNT acts as an electrode capacitor with charge injected into the CNT, which is then balanced by an electrical double-layer formed by movement of electrolytes to the CNT surface. Changing the charge on the carbon atoms results in changes of C—C bond length. As a result, expansion and contraction of single CNT can be observed.

FIGS. 1 and 2 show two possible operating modes for an EAP device.

The device comprises an electroactive polymer layer 8 sandwiched between electrodes 4, 6 on opposite sides of the electroactive polymer layer 8.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 10. A voltage is used to cause the electroactive polymer layer to curve or bow.

Together, the electrodes, electroactive polymer layer, and carrier may be considered to constitute the overall electroactive polymer structure.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

An electroactive polymer structure as described above may be used both for actuation and for sensing. The most prominent sensing mechanisms are based on force measurements and strain detection. Dielectric elastomers, for example, can be easily stretched by an external force. By putting a low voltage on the sensor, the strain can be measured as a function of voltage (the voltage is a function of the area).

Another way of sensing with field driven systems is measuring the capacitance-change directly or measuring changes in electrode resistance as a function of strain.

Piezoelectric and electrostrictive polymer sensors can generate an electric charge in response to applied mechanical stress (given that the amount of crystallinity is high enough to generate a detectable charge). Conjugated polymers can make use of the piezo-ionic effect (mechanical stress leads to exertion of ions). CNTs experience a change of charge on the CNT surface when exposed to stress, which can be measured. It has also been shown that the resistance of CNTs change when in contact with gaseous molecules (e.g. $O_2$, $NO_2$), making CNTs usable as gas detectors.

Mechanical actuators in general can be characterized in terms of terms a particular set of stress-strain combination which, in their actuation performance, they are capable of realizing. This range of achievable stress-strain combinations is constrained by the inherent properties of the actuator, and possible applications for the actuator will be limited as a result.

For electroactive material actuators, it would be desirable to extend the range of achievable stress-strain combinations, to thereby broaden the potential applications for the technology. Improvement in this area has so far been achievable only through constructing complex compound actuator structures, formed of combinations of multiple EAP actuators coupled together. Such structures are complex to fabricate, have large form factor, and require significant additional driving electronics to control. This in itself restricts the range of applications for these solutions.

In addition to limitations in actuation performance, state of the art EAP actuators are also limited in achievable sensing performance. It is known that an extent of actuation of an EAP actuator can be detected through superposition of a low-amplitude AC sensing signal to the actuator driving signal. However the sensing performance using these methods is limited. In particular, the signal to noise ratio of an EAP is somewhat restrictive, and as a consequence applications requiring a high degree of precision in feedback measurements typically require additional sensors to be provided.

It has been known to augment an EAP actuator with an additional dedicated sensing layer to facilitate more precise sensing measurements. However, this adds to the complexity and form factor of the actuator, and can also lead to potential deterioration in the lifetime of the actuator due to delamination of the sensing layer as a result of frequent actuation cycles.

EAM-based actuators and methods are generally sought therefore which are capable of offering improved actuation performance, and/or are capable of offering improved feedback sensing regarding an extent of deformation of the actuator.

SUMMARY OF THE INVENTION

It is known more broadly within the field of actuator devices to embed magnetic particles within a passive polymer matrix in order to provide a device capable of deforming in different ways to provide actuation effects. The range of actuation motions and forces achievable with such devices is known to be limited however.

Document US 2009/0165877 describes a number of actuator devices for use in micro-fluidic systems. In one set of embodiments, the actuators are adapted to deform in response to application of an electric field. These may comprise an electroactive polymer material to facilitate this effect. In a separate set of embodiments, the actuators are adapted to be responsive to application of a magnetic field. These may comprise magnetic particles to facilitate this functionality.

It is also known within the field of magnetic sensors to use magnetic particles embedded within a piezoelectric material matrix to enable sensing of magnetic field strengths. JP 2000038643 for example discloses a magnetic sensor fabricated by dispersing magnetically responsive particles in a piezoelectric matrix. Changes in magnetic energy induce a mechanical response in the magnetic particles, which then apply stresses to the piezoelectric matrix. These stresses are detectable in consequently induced piezoelectric currents.

It has been realised by the inventors that with suitable modifications, it may be possible to incorporate some of these effects into the field of electroactive material devices in order to improve actuation or sensing functionality.

The invention is defined by the claims.

The invention relates generally to electroactive material actuators having incorporated magnetic particles for facilitating enhanced actuation and/or sensing effects. Features of any of the below outlined examples may be advantageously combined.

According to an aspect of the invention, there is provided an actuator device, comprising:
  an actuator member, comprising
  an electroactive material being adapted to deform in response to application of an electrical stimulus; and
  particles of a soft magnetic material dispersed within the electroactive material;

a magnetic field generation means operable to generate a magnetic field of a configurable field strength pattern for application to the actuator member;

an electrical stimulus generation means; and a controller operable to control the magnetic field generation means and the electrical stimulus generation means in a coordinated manner to thereby realize one or more deformation patterns in the actuator member.

Embodiments of the invention are based on the concept of incorporating soft magnetic particles within an electroactive material member to thereby provide an actuator which incorporates the properties of both electric and magnetic responsiveness. These two functionalities are utilized in embodiments to provide actuation effects which extend beyond those achieved or achievable with state of the art devices utilizing only one or the other.

The electroactive material (EAM) may, in accordance with particular examples, be an electroactive polymer material (EAP).

The controller is operable to provide coordinated control of an electrical stimulus generation means and a magnetic field generation means to thereby induce one or more deformation shapes, configurations or actions in the actuator member. The controller may in examples be operable to provide coordinated control of the two means to thereby induce a program of one or more deformation shapes, configurations or actions in the actuator member.

The coordinated control may include activating the two means simultaneously, and/or may include activating the two means sequentially. The controller may for instance be configured in accordance with at least one mode of operation to activate the magnetic field and electric field together to thereby provide a compound deformation in the actuator member having for instance an enhanced magnitude or reach compared with that achievable using either electrical or magnetic stimulation alone.

Additionally or alternatively, the controller may be configured in accordance with at least one mode of operation to activate the two means simultaneously to provide a particular shape or deformation pattern in the actuator member having an additional degree of complexity or intricacy compared with shapes that might be achievable using a single stimulation means only.

For example, the two means may be utilized together to provide a compound actuation shape, formed of a basic deformation (such as for instance a uniform bending across the whole member caused for instance by electrical stimulation), to which an additional local deformation superposed on top (induced for instance through magnetic stimulation of particles within at least a local region of the actuator member). In this way, embodiments of the invention are capable of providing new actuation effects which extend beyond those previously achievable.

By way of further example, in accordance with one or more examples, the magnetic field and electric field generation means may be controlled in a sequential activation pattern to provide one or more actuation shapes or effects. Sequential control might be utilized to provide a progression of different particular actuation shapes or configurations and/or may be used to provide dynamic actuation effects, such as undulation or oscillatory behavior. Such sequences of electrical and/or magnetic stimulation may form a program of deformation patterns which the controller is configured to induce.

The combination of magnetic particles with EAP material hence effectively provides an additional degree of freedom in controlling deformation of the actuator member. This may be advantageously used to achieve more complex or more mechanically powerful actuation movements and effects.

The electrical stimulus generation means may by way of example be a set of electrodes for applying an electric field across at least a section of the actuator member. The means may alternatively include a current source electrically coupleable to the actuator member for providing an electrical current across at least a section of the actuator member.

The magnetic field generation means may by way of example be a controllable magnet (i.e. electromagnet). The means may additionally or alternatively include a conductive coil for carrying a circulating electric for establishing a magnetic field. This may be a solenoid for instance. In some examples, the coil may be wound around at least a section of the actuator member. In alternative examples, the coil may be arranged adjacent to a section of the actuator member.

In all examples, the magnetic field generation means is operable to generate a field of a configurable field strength pattern, by which is meant more broadly, a magnetic field having configurable vector field quantities across the space extending through at least a section of the actuator member. A magnetic vector field is often represented by a set of magnetic field lines which indicate directionality of the field in a particular region of space. The magnetic field lines of the magnetic field may be configurable in accordance with embodiments of the invention.

In accordance with one or more embodiments of the invention, non-uniform deformation patterns can be realised across the actuator member, i.e. locally varying deformation patterns.

Accordingly, in accordance with one or more embodiments, the magnetic field generation means may be configured to generate a magnetic field of non-uniform field strength for application across the actuator member; and/or the particles of a soft magnetic material may be dispersed non-homogenously in the actuator member;

so as in either case to achieve a non-uniform deformation pattern across the actuator member.

There may in examples be achieved the non-uniform deformation pattern, the non-uniformity being along a given dimension, by generating a magnetic field having field strength which is non-uniform along that dimension.

By non-uniform deformation pattern may be meant a pattern inducing a non-uniform surface relief pattern or non-uniform surface profile in particular examples.

In accordance with one or more embodiments, the controller may be operable to induce any of a pre-defined set of deformation patterns in the actuator member. The controller may for example have a memory comprising program instructions for realizing in the actuator member any of a plurality of different actuation modes or configurations. These program instructions may include particular settings or command combinations for controlling the electrical stimulus generation means and the magnetic field generation means in a coordinated manner. These program instructions may include instructions for controlling the electrical stimulus generation means and the magnetic field generation means to operate together or to operate separately for example in sequential fashion.

In accordance with one or more examples, the controller may be operable to execute a pre-determined control schedule for controlling deformation of the actuator member, the control schedule including steps for controlling both the electrical stimulus generation means and the magnetic field generation means, and optionally wherein said control schedule includes steps dependent upon one or more input parameters.

The input parameters may in accordance with one or more examples include one or more user input commands. User input commands may be received from one or more user interface units and may include commands indicating a particular one or more control modes which are to be executed or indicating one or more deformation patterns which are to be realised, or may simply be used to trigger activation or deactivation of the actuator (in any of a range of control modes).

Additionally or alternatively, the input parameters may include parameters obtained or received from one or more sensor devices or sensing elements. The sensing elements may include for example components for determining an extent of actuation such as for instance will be described in more detail in accordance with examples detailed below.

The term 'soft' magnetic material refers broadly to those magnetic materials which exhibit reversible magnetization. They generally have the property of becoming magnetized upon exposure to a magnetic field, but lose said magnetization upon removal of the magnetic field. This contrasts with so-called hard magnetic materials which exhibit a sustained or permanent magnetization even in the absence of an applied external magnetic field.

In accordance with one or more particular examples, the particles of a soft magnetic material may comprise at least one of: a soft ferromagnetic material, a paramagnetic material, and a superparamagnetic material.

In accordance with one or more sets of embodiments, the soft magnetic material may be a magnetostrictive material for realizing a contraction or expansion of the actuator member in response to application of a magnetic field by the magnetic field generation means.

In particular examples of these embodiments, the magnetic field generation means may be configured to generate a magnetic field of uniform field strength for application across the actuator member. By uniform field strength is meant having a field strength which is independent of position, and in particular which is the same throughout the extent of the actuator member body. A uniform magnetic field might otherwise be known as a homogenous magnetic field.

In the presence of a magnetic field of uniform field strength, the magnetostrictive particles experience no attractive or repulsive magnetic force, but are magnetically stimulated to change or deform in shape or size. This deformation of the particles results in a corresponding deformation of the surrounding electroactive material matrix and therefore of the actuator member as a whole. On a macro scale these magnetically induced deformations result in an expansion or contraction of the actuator member.

In further examples in accordance with any embodiment of the present invention, the magnetic field generation means may be configured to generate a magnetic field of non-uniform magnetic field strength for application across the actuator member. By non-uniform magnetic field strength is meant a field strength which varies in dependence upon position, and in particular which varies across the body of the actuator member.

More particularly, in the present case, the field may exhibit a decline in field strength in direction(s) away from the magnetic field generation means, for instance as a function of distance from the magnetic field generation means. A non-uniform field may otherwise be known as a spatially inhomogeneous magnetic field.

In the presence of any magnetic field (uniform or non-uniform), a soft magnetic material is stimulated to exhibit a magnetization parallel with and in the same direction as said applied magnetic field. In the presence of a non-uniform magnetic field in particular, any magnetized particle will experience a net force as a result of an imbalance of forces acting upon its two 'poles'. In the present case of soft magnetic particles, where the magnetization of each particle is parallel and co-oriented with the applied magnetic field, the particles each experience a net force in the direction of the (positive) gradient of the field at the location of the particle. Where the magnetic field is decreasing in strength in directions away from the magnetic field generation means (as in the present example), each soft magnetic particle experiences an attractive force towards the magnetic field generation means.

Hence by applying a non-uniform magnetic field in accordance with the presently described examples, the magnetic particles experience an attractive force toward the magnetic field generation means. By appropriately controlling the magnetic field generation means to stimulate magnetic fields of particular field strength patterns, particular deformation patterns in the actuator member can be effected. In particular, the actuator member may in examples be induced to bend or warp in the direction of the magnetic field generation means (in particular if the actuator member is clamped at each end).

Accordingly, in accordance with one or more embodiments the controller may be operable to induce a bending in at least a section of the actuator member in a given direction by controlling the magnetic field generation means to generate a magnetic field of non-uniform magnetic field strength having magnetic field lines extending through the actuator member in a direction antiparallel to said given bending direction.

In accordance with one or more embodiments, the magnetic particles may be suspended in polymer droplets within the electroactive material, the polymer droplets having a viscosity lower than that of the electroactive material. In this case, the droplets follow any electrically induced deformation of the actuator member but do not migrate through the EAP matrix upon application of a magnetic field. The two materials may be immiscible. The effect of provision of such droplets may be reduced resistance within the actuator member against the deformation of the EAP matrix. This is because upon deformation of the EAP, the polymer particles are able to deform without incurring significant resistance against the surrounding EAP. This is in contrast to a system in which magnetic particles are directly embedded within the EAP matrix. In the latter case, the particles do exert a partial resistance against deformation of the EAP, since EAP molecules must migrate (shear) along the surface of the particles. Shearing against the droplets does also occur, but since the viscosity of these droplets is significantly lower than that of the EAP polymer, the partial resistance against the deformation is less.

In accordance with one or more sets of embodiments, the particles of a soft magnetic material may be dispersed non-homogenously in the actuator member, so as to achieve non-uniform deformation patterns.

In particular, the particles may in examples be arranged in a set of spatially discrete concentrations within the actuator member. Preferably in these cases the electroactive material is of a viscosity such as to prevent migration of particles through the material upon exertion of a magnetic force by the magnetic field of the magnetic field generation means.

The magnetic field generating means may in these cases be operable to generate a magnetic field having different magnetic field strengths across each of said set of spatially discrete concentrations. The controller may be configured in accordance with a particular control mode to control the magnetic field generation means to generate said magnetic field of different magnetic field strengths. In this way, different local sections or regions of the actuator member may be induced to deform to different extents or in different patterns or configurations.

Hence, in these embodiments, more complex and intricate actuation patterns and actions are achievable. In particular, where this localized control over deformation is combined with electrically stimulated deformation, a broad scope of possible deformation patterns and actuation movements and actions are realizable. This therefore significantly widens the scope of potential applications for the provided actuator members and also enhances their performance within already established applications.

In examples in accordance with a further aspect of the invention, there is provided an actuation method, the method making use of an actuator member comprising: an electroactive material being adapted to deform in response to application of an electrical stimulus; and particles of a soft magnetic material dispersed within the electroactive material;

and the method comprising:

controlling a magnetic field generation means, operable to generate a magnetic field of a configurable field strength pattern, and an electrical stimulus generation means in a coordinated manner so as to thereby realize one or more deformation patterns in the actuator member.

In accordance with examples, there is provided an actuator device, comprising:

an actuator member, comprising an electroactive material being adapted to deform in response to application of an electrical stimulus; and particles of a hard magnetic material dispersed within the electroactive material, and ordered such that at least a section of the actuator member exhibits a magnetization in a given direction;

a magnetic field generation means operable to generate a magnetic field of a configurable field strength pattern for application across at least a section of the actuator member;

an electrical stimulus generation means; and a controller operable to control the magnetic field generation means and the electrical stimulus generation means in a coordinated manner to thereby realize one or more deformation patterns in the actuator member.

These examples are based on a similar concept to that described above, namely the incorporation of magnetically responsive particles within the body of an electroactive material member. These examples however make use of hard magnetic particles rather than soft magnetic particles. Hard magnetic particles as explained above are characterized in exhibiting a persistent or permanent magnetization which is not dependent upon an externally applied magnetic field. This introduces wide range of new possibilities and options for controlling deformation of the actuator member to achieve new and interesting actuation patterns and effects.

As in examples above, the coordinated control may include activating the two means simultaneously, and/or may include activating the two means sequentially.

The controller may in examples be operable to induce any of a pre-defined set of deformation patterns in the actuator member.

The controller may in accordance with one or more sets of examples be operable to execute a pre-determined control schedule for controlling deformation of the actuator member, the control schedule including steps for controlling both the electrical stimulus generation means and the magnetic field generation means, and optionally wherein said control schedule includes steps dependent upon one or more input parameters. The input parameters may be user input commands.

In accordance with one or more particular examples, the particles of a hard magnetic material may comprise at least one of: a hard ferromagnetic material; a ferrite material, SmCo, and NdFeB.

As in examples previously described, the hard magnetic material may be a magnetostrictive material for realizing a contraction or expansion of the actuator member in response to application of a magnetic field by the magnetic field generation means.

In a particular subset of these examples, the magnetic field generation means may be configured to generate a magnetic field of uniform or non-uniform magnetic field strength for application across the actuator member, where these terms are to understood as defined above.

In the presence of a magnetic field of uniform magnetic field strength, the magnetostrictive particles experience no attractive or repulsive magnetic force, but are magnetically stimulated to change or deform in shape or size. This deformation of the particles results in a corresponding deformation of the surrounding electroactive material matrix and therefore of the actuator member as a whole. On a macro scale these magnetically induced deformations result in an expansion or contraction of the actuator member.

In the presence of a magnetic field of non-uniform magnetic field strength (for instance decreasing in strength away from the magnetic field generation means), a hard magnetic material experiences a net force. The direction of the force is dependent upon the direction of its own magnetization. In particular, if the magnetization of the hard magnetic particles is parallel and co-oriented with the applied magnetic field, then the magnetic particles will experience a force in the direction of the (positive) gradient of the magnetic field strength at the point of the particle's location. Where the magnetic field strength decreases in directions away from the magnetic field generation means, the particles will in this case experience and attractive force toward the magnetic field generation means.

On the contrary, if the magnetization of the hard magnetic particles is oppositely directed to the general direction of the magnetic field, the particles will experience a magnetic force in the direction opposite to that of the gradient the field at the location of the particle. Again, assuming the magnetic field decreases in directions away from the magnetic field generation means, the magnetic particles in this case will experience a repulsive force, pushing them away from the magnetic field generation means.

Hence in examples, bidirectional deformation becomes achievable since the direction of deflection of the particles may be varied in dependence upon the direction of the applied magnetic field. In particular, different sections of the actuator member may be controlled to deflect either towards or away from the magnetic field generation means in dependence upon the direction in which the field lines generated by the field generation means cross said sections.

More particularly, the controller may in examples be configured to realize a bending of the actuator member in a direction antiparallel with the direction of magnetization of said at least section of the actuator member by controlling the magnetic field generation means to generate a magnetic field of non-uniform magnetic field strength having magnetic field lines extending through the actuator member in substantially the same direction as the magnetization.

Additionally or alternatively, the controller may in examples be configured to realize a bending of the actuator member in a direction parallel with the direction of magnetization of said at least section of the actuator member by controlling the magnetic field generation means to generate a magnetic field of non-uniform magnetic field strength having magnetic field lines extending through the actuator member in a direction substantially opposite to the direction of magnetization.

In accordance with one or more examples, the controller may be configured to realize oppositely directed bending in at least two neighboring sections of the actuator member by controlling the magnetic field generation means to generate and apply a magnetic field of non-uniform field strength across the actuator member having magnetic field lines extending across said neighboring sections in respectively opposite parallel directions to the direction of magnetization of the actuator member. In accordance with these examples, neighboring sections may be controlled to exhibit a deflection or deformation (for example a bending) in different respective directions with respect to the magnetic field generation means. This is achieved by applying a magnetic field across those respective sections with different directionalities.

In particular examples, the controller may be configured to sequentially activate the magnetic fields for each of said respective neighboring sections, to thereby realize a wave-like motion in the actuator member. An undulating or wiggling motion is achievable by controlling the oppositely directed deflection of each of a set of neighboring sections to activate sequentially one at a time, rather than simultaneously en bloc. Such undulating motion may be useful or advantageous in a range of applications, for example in microfluidic systems for propelling or moving fluid, for achieving certain mechanical 'lubrication' effects, or for achieving propulsion or motion of any solid or fluid body engaged with the undulating surface of the actuator member.

In accordance with one or more subsets of examples, the particles of a hard magnetic material may be dispersed non-homogenously in the actuator member, so as to achieve non-uniform deformation patterns.

In particular, the particles may in examples be arranged in a set of spatially discrete concentrations within the actuator member.

The magnetic field generating means may in these cases be operable to generate a magnetic field having different magnetic field strengths across each of said set of spatially discrete concentrations. The controller may be configured in accordance with a particular control mode to control the magnetic field generation means to generate said magnetic field of different magnetic field strengths. In this way, different local sections or regions of the actuator member may be induced to deform to a different extent, in different directions, or in different patterns or configurations.

Hence, in these examples, more complex and intricate actuation patterns and actions are achievable. In particular, where this localized control over deformation is combined with electrically stimulated deformation, a broad scope of possible deformation patterns and actuation movements is realizable. This therefore significantly widens the scope of potential applications for the provided actuator members and also enhances their performance within already established applications.

Further examples provide an actuation method, the method making use of an actuator member comprising:
 an electroactive material being adapted to deform in response to application of an electrical stimulus, and
 particles of a hard magnetic material dispersed within the electroactive material, and being ordered such that at least a section of the actuator member exhibits a magnetization of a given direction,
 and the method comprising:
 controlling a magnetic field generation means, operable to generate a magnetic field of a configurable field strength pattern, and an electrical stimulus generation means in a coordinated manner so as to thereby realize one or more deformation patterns in the actuator member.

In accordance with further examples, there is provided an actuator device, comprising
 an actuator member, having a thickness, and comprising
  an electroactive material being adapted to deform in response to application of an electrical stimulus; and
  particles of a magnetic material dispersed within the electroactive material;
 a magnetic field sensor, adapted to detect the strength of a magnetic field within, or proximal to, at least a section of the actuator member; and
 a controller, adapted to determine, based on outputs from the magnetic field sensor, an indication of a change in a shape of the actuator member.

These examples are based on the use of magnetic particles embedded within an electroactive material member to provide actuator devices having certain intrinsic sensing capabilities. In particular, present examples are controllable to provide an accurate indication of an aspect of a change in a shape of the actuator member in real-time and in concurrence with electrical stimulation of the actuator member. Examples are hence, in accordance with at least some cases, able to provide real-time feedback with regards an extent of deformation of the actuator member (as embodied in a change in shape of the member). These sensing capabilities may in examples be advantageously incorporated into embodiments of the invention described above, as will be described in greater detail in paragraphs to follow.

The controller in accordance with one or more examples may be adapted to determine an indication of a change in thickness of the actuator member. The actuator member may for example have a layer like structure comprising opposing major surfaces. In this case, thickness is to be understood as the dimension of the actuator member extending between the two major surfaces, in a direction normal to each. However more generally, the thickness may refer to any arbitrary dimension of the actuator member, but may more typically refer to a smaller, or the smallest, of the three dimensions of any actuator member provided in accordance with these examples.

Although concepts of these examples will be described below in relation to measurement of a change in thickness of the actuator member, it is to be understood that in further examples the concepts may readily be applied to determination of other aspects of a shape change. These may, by way of non-limiting example, include changes in width, height or length of the actuator member, or changes in curvature or in topology of the actuator member. Shape changes may in further examples include changes in the overall profile or contour of the actuator member. This may be achieved for instance by applying determination methods or steps described below to a plurality of different sections of the actuator member and processing the results to determine how an overall shape or profile of the actuator member has changed.

In accordance with at least one subset of examples, the controller may be adapted to determine, based on said outputs from the magnetic field sensor, a change in the magnetic field strength, and to determine said change in the shape of the actuator member based on said determined change in field strength. This determination may be based on a known direct or indirect relationship between these two values for example. The determination may be based on an equation or expression relating the two values or may in alternative examples for instance be based on use of a lookup table being accessible to the controller for performing the determination.

In accordance with at least one subset of examples, the controller may further be configured to induce a deformation of the actuator member by application of an electrical stimulus to the actuator member and/or application of a magnetic field to the actuator member. The controller in accordance with these examples is hence configured to control both actuation and sensing behavior of the actuator. The actuation control of the actuator member may include magnetically stimulated deformation and/or electrically stimulated deformation. Sensing feedback may in examples be obtained by the controller in concert with control of deformation by electrical and/or magnetic means. More particularly, the controller may be operable to induce said deformation simultaneously with determining said change in shape of the actuator member.

Application of said electrical stimulus may be achieved through further inclusion within the actuator device of an electrical stimulus generation means. Alternatively, the controller may be operatively coupled or coupleable with an external electrical stimulus generation means. The stimulus may in examples be an electrical current or may in further examples be an electrical field.

In accordance with one or more examples, the controller may be adapted to control a shape or extent of the deformation induced in the actuator member in dependence upon said determined shape change. The intrinsic sensing capabilities of the presently described examples may hence be used to directly inform control of deformation of the actuator member. For example, the controller may be configured in at least one control mode to continue increasing an applied actuation voltage until a particular threshold thickness (or other dimensional or shape threshold) of the actuator member is met. At this point, the controller may be configured to maintain the voltage at the fixed level in order to maintain the thus achieved deformation level. Further examples will be described in greater detail in sections to follow.

In all of the presently described set of examples, the controller is configured to provide at least an indication of a change in shape (for example thickness) of the actuator member. The indication may in some examples consist in a numerical determination of an aspect of a change in its shape. Alternatively the indication may consist in some other variable or parameter which may provide a proxy measure or indication of a change in the shape.

In some examples, the controller may be adapted to identify, based on outputs from the magnetic field sensor, an indication of the thickness of the actuator member. In these examples, an indication of the total or absolute thickness of the actuator member is obtained rather than merely an indication of a change in thickness. This may be a numerical measure of the absolute thickness or may alternatively comprise some other value or parameter being directly or indirectly correlated with the thickness.

As noted above, the sensing functionalities provided in this set of examples may be advantageously combined or incorporated into embodiments of the invention described above or into or with any examples described above. In particular, the magnetic particles may be soft magnetic particles, in accordance with the invention, or hard magnetic particles, and may include magnetostrictive particles. Particular examples relating to each of these options will now be briefly outlined.

In accordance at least one set of examples, the particles may be particles of a hard magnetic material, wherein the controller is adapted to determine said indication of the change of shape of the actuator member based on a known direct or indirect relation between the detected magnetic field strength and the actuator member shape.

In particular examples, the controller may comprise a memory, and may be adapted to determine said indication of the change of shape of the actuator member by means of a pre-defined lookup table stored in said memory, the lookup table storing actuator member shape (e.g. thickness) values associated with each detected magnetic field strength.

Alternatively, the controller may be configured to determine a change in a detected magnetic field strength over a given interval of time, and wherein the lookup table stores shape change values associated with a range of possible detected magnetic field strength changes. The measured change in field strength may then be identified within the lookup table, and a corresponding change in shape thus determined.

In accordance with at least one subset of examples, the particles may be particles of a magnetostrictive magnetic material, wherein the controller is adapted to determine said indication of a change in the shape based on a determined change in the exhibited magnetization of the actuator member. Magnetostrictive particles are typically characterized in exhibiting a magnetization (either permanent or field-induced) which varies or fluctuates in a predictable manner in response to the application of forces or strains. By monitoring changes in the exhibited magnetization using the magnetic field sensor, it is possible to determine an indication of a change in shape based on known material properties of the actuator member, e.g. based on a known elasticity or otherwise based on a known relationship between actuator shape changes and induced stresses within the body of the actuator member material.

Accordingly, the controller is configured to determine said indication of a change in the shape based on a known relation between the change in actuator member shape and the change in the magnetization induced by the particles.

In accordance with at least one subset of examples, the particles may be particles of a soft magnetic material, wherein the controller is adapted to determine, based on said outputs from the magnetic field sensor, a change in magnetic permeability across the actuator member, and to determine said indication of a change in shape of the actuator member based said determined change in magnetic permeability.

In particular, a change in actuator member thickness may, in accordance with one or more examples, be determined based on the relation $$\mu = \alpha N d / \langle g \rangle \quad (1)$$

where $\alpha$ is a material-dependent constant, N is the number of particles per unit cross-sectional area perpendicular to the thickness, d is a dimension of each particle in a direction parallel to the thickness, and <g> is the average inter-distance between the particles in a direction parallel to the thickness.

If the actuator member is deformed in a direction parallel with the thickness (for example through application of an electrical stimulus), the size of the inter-distance gap <g> changes as the particles become either compressed closer to one another (in the case of compression) or pull further apart from one another (in the case of expansion). This change in the inter-distance gap is measurable in an incurred change in the magnetic permeability in accordance with the relation (1) above.

Particular detected changes in magnetic permeability may be related by the controller to corresponding changes in actuator member shape (e.g. thickness) using a lookup table. Alternatively, it may be calculated by the controller based on determined changes in <g> (derived from measured changes in μ), and upon a known relation between <g> and actuator shape. This might be an experimentally derived relation, particular to the specific actuator member in question, or alternatively may be a theoretically derived relation.

In accordance with one or more examples, the particles may have a non-circularly symmetric cross-section. More generally, the particles may have an aspect ratio greater than 1, i.e. may have a cross-section with a length dimension greater than a width dimension. This asymmetry helps to enhance the sensitivity of the material to applied deformations in terms of the exhibited change in magnetic permeability: a smaller change in shape leads to a larger response in terms of change in magnetic permeability. This may improve the precision of determined changes in actuator shape.

The magnetic permeability may in examples be determined by measuring the auxiliary magnetic field H induced across the actuator member in response to application of an external magnetic field B. From the quotient of B and H, magnetic permeability directly follows (i.e. B=μH).

Accordingly, the actuator device may in accordance with one or more examples further comprise a magnetic field generation means for applying a magnetic field across the actuator member, wherein the magnetic field sensor is arranged to detect the strength of said applied magnetic field across the actuator member. The magnetic field may be measurable by a magnetic recording head or a Hall sensor for example.

In examples, the controller may be operatively coupled to said magnetic field generation means and adapted to control the means so as to apply said magnetic field to the actuator member.

Furthermore, in particular examples, the electroactive material may have a viscosity sufficient to prevent migration of the particles through the material upon exertion of a magnetic force by the magnetic field of the magnetic field generation means. This ensures a consistent distribution of particles across the actuator member, thereby ensuring that measured changes in magnetic permeability can be reliably related to a corresponding change in actuator member shape.

In accordance with any of the presently described set of examples, the particles of a magnetic material may be dispersed non-homogenously within the actuator member, to form a set of spatially discrete concentrations of particles, and wherein the magnetic field sensor comprises means for independently detecting the magnetic field strength across each of said spatially discrete concentrations.

This may enable more subtle or intricate sensing capability, wherein changes in shape (e.g. thickness) of different sections of the actuator member may be independently measured. This may for example be particularly advantageous in cases where the actuator member is adapted to be deformable in accordance with non-uniform deformation patterns. In these cases, different sections of the actuator member may be controllable to adopt different particular shapes or configurations to thereby provide a more intricate overall deformation pattern. Here, sensing of thickness change for example across each of these individual sections may be particularly advantageous in providing feedback for controlling the actuator member for instance.

Additionally or alternatively, such compound sensing capability may enable determination of changes of more complex aspects of the actuator member shape, such as changes in the overall profile of the member. By monitoring how each of a series of consecutive sections of the member change thickness or length for example, it is possible to determine how an overall outline or profile of the member changes.

Further examples also provide a method for sensing a change in shape of an actuator member, the actuator member comprising:
an electroactive material being adapted to deform in response to application of an electrical stimulus, and
particles of a magnetic material dispersed within the electroactive material,
and the method comprising:
receiving inputs from a magnetic field sensor, adapted to detect the strength of a magnetic field within, or proximal to, at least a section of the actuator member, and
determining, based on said inputs from the magnetic field sensor, an indication of a change in the shape of the actuator member.

BRIEF DESCRIPTION OF THE DRAWINGS

Examples will now be described in detail with reference to the accompanying drawings, in which:

FIG. 5 schematically illustrates activation of the example actuator device of

FIG. 4 with a single magnetic field rather than multiple magnetic fields;

DETAILED DESCRIPTION OF THE EMBODIMENTS

The invention relates generally to electroactive material actuators comprising for example an electroactive polymer, having embedded magnetic particles for facilitating enhanced actuation and/or sensing effects.

Examples provide an actuator device including an EAM actuator member having embedded soft magnetic particles and further including means for applying an electrical stimulus and a magnetic field to the actuator member. A controller is adapted to control these two means in a coordinated manner to thereby realize one or more deformation patterns in the actuator member.

Examples provide an actuator device including an EAM actuator member having embedded hard magnetic particles and further including means for applying an electrical stimulus and a magnetic field to the actuator member. A controller is adapted to control these two means in a coordinated manner to thereby realize a one or more deformation patterns in the actuator member.

Examples provide an actuator device including an EAM actuator member having embedded magnetic particles and further including a magnetic field sensor for detecting the strength of a magnetic field within or proximal to the body of the actuator member. A controller is configured to determine based on outputs from the magnetic field sensor an indication of a change in shape of the actuator member. The controller may in particular determine a change in thickness of the actuator member. In particular examples, the determined change in shape may be used as feedback in controlling the deformation pattern of the actuator member.

Figure 1:
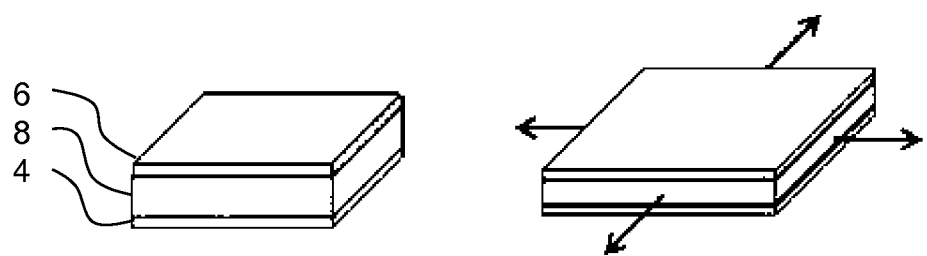
FIG. 1 shows a known electroactive polymer device which is not clamped.
Figure 2:
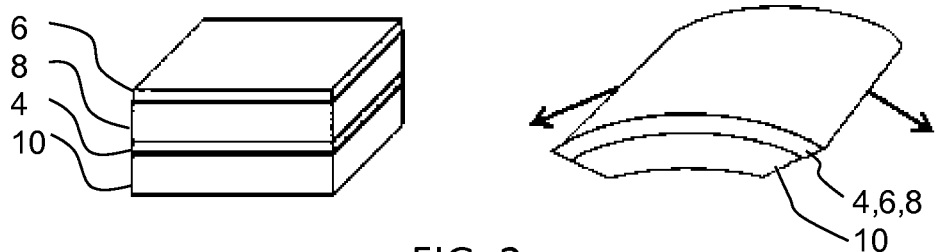
FIG. 2 shows a known electroactive polymer device which is constrained by a backing layer.
Figure 3:
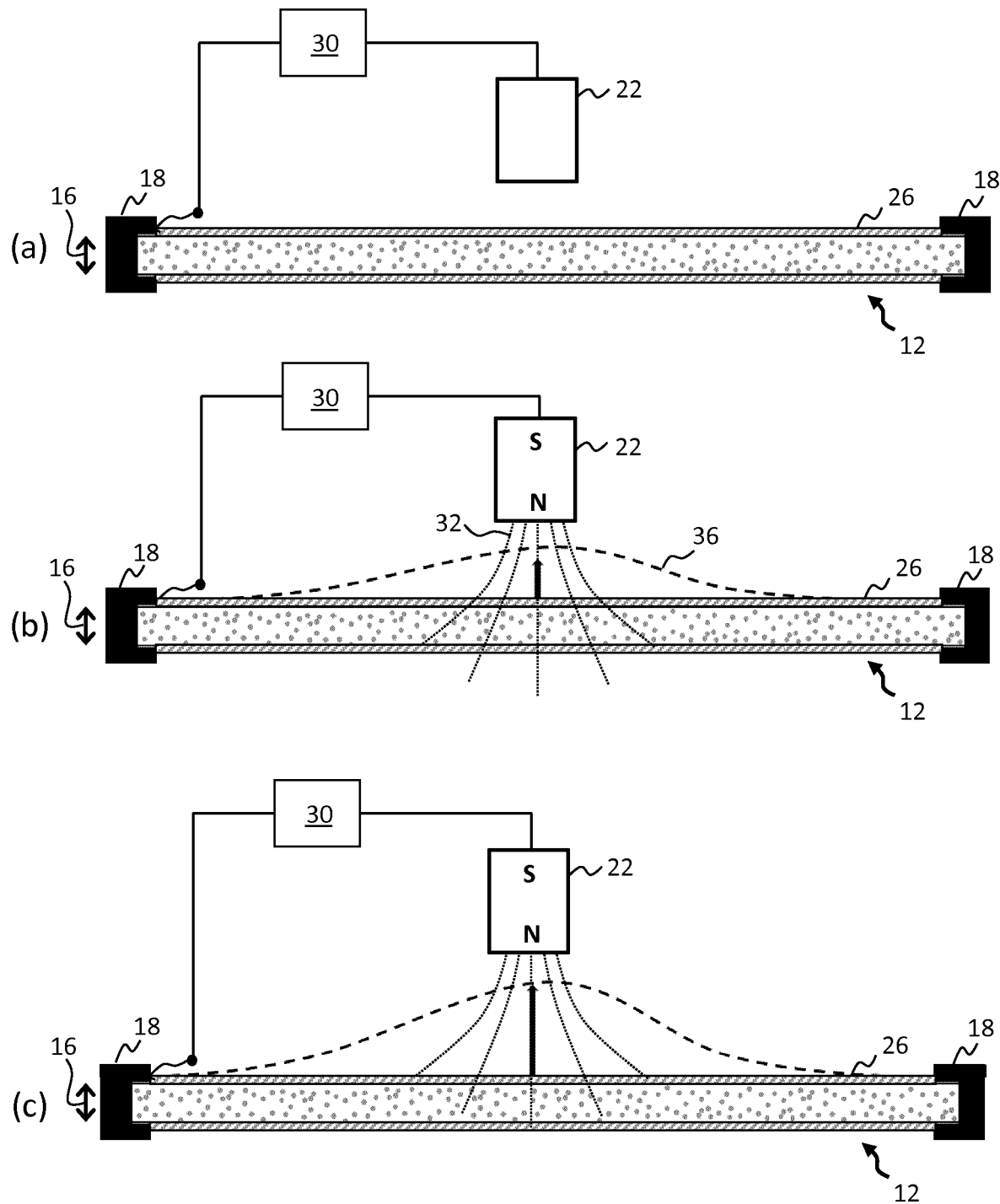
FIG. 3 schematically illustrates an example actuator device.

FIG. 3 illustrates a first example actuator device. The device comprises an actuator member 12, having a thickness 16, and comprising an electroactive polymer material incorporating a plurality of dispersed magnetic particles. The actuator member is clamped at either end by a respective clamp 18. The two clamps guide any lateral expansion of the actuator member into an out of plane bending or deformation.

Arranged proximal to the actuator member 12 is a magnetic field generation means 22, operable to generate a magnetic field having magnetic field lines extending across the body of the actuator member. The magnetic field generation means may comprise a controllable electro-magnet such as a solenoid, in the form of a conductive coil or winding. The magnetic field generation means may alternatively be a permanent magnet, although this may not be preferable since it would require further means for physically relocating the magnet to and from the actuator member in order to change the applied magnetic field strength (or to cease application of a field altogether).

Although the magnetic field generation means is shown displaced from the actuator member in FIG. 3, in further examples, the magnetic field generation means may be arranged in contact with the actuator member. In accordance with one or more examples, the magnetic field generation means may comprise a coil, the coil being wound around at least a section of the actuator member 12.

The actuator device further comprises a pair of electrodes 26, being affixed to opposing major surfaces of the actuator member 12. The electrodes may, by way of example, be laminated onto each of said major surfaces. Alternatively, any other fixing or securing means may also be used. Suitable means for coupling the electrodes with the actuator member will be immediately apparent to the skilled person.

The pair of electrodes 26 provides an electrical stimulus generation means for generating and applying an electrical stimulus to the electroactive polymer material of the actuator member 12, and thereby inducing deformation of the actuator member. In particular the electrodes are operable to apply an electric field across the thickness 16 of the actuator member. The electroactive polymer material may in this case be a field driven electroactive polymer material such as an elastomer or other suitable field driven electroactive polymer material (suitable examples outlined above, in also in further passages below).

Although in this particular example, an electrical stimulus generation means is provided in the form of a pair of electrodes 26, in further examples, means may additionally or alternatively be provided for applying an electrical current. This may include for instance a pair of electrical contacts electrically coupled to the actuator member at a pair of respective points on the actuator member. In these cases, the electroactive polymer material may be an ionic electroactive polymer in accordance with examples described above or in further passages to follow below.

The actuator device further comprises a controller 30 being operatively coupled with the magnetic field generation means 22 and the pair of electrodes 26 and being operable to control the two means in a coordinated manner to realize a program of one or more deformation patterns in the actuator member 12. In the particular example of FIG. 3, the controller is electrically coupled with the magnetic field generation means and the pair of electrodes and is adapted to implement control the two means through delivery of a controllable electrical current or voltage to each means. By controlling the electrical current or voltage delivered to the electrical field generation means, the magnitude of the applied field may be varied. By controlling the electrical voltage delivered to the electrode pair 26, the strength of the electric field induced across the thickness 16 of the actuator member 12 may also be controlled.

In further examples, the magnetic field generation means 22 may be further provided with a separate dedicated power supply, and wherein the controller 30 is adapted to control the strength or field pattern of the magnetic field generated by the means 22 through transmittal of control commands via an operative coupling.

In accordance with the presently described example, the magnetic particles dispersed within the EAP material are particles of a soft magnetic material. However, it is to be understood that the actuator device structure illustrated in FIG. 3 is entirely compatible with an actuator member 12 which comprises soft magnetic particles or hard magnetic particles. Specific examples incorporating hard magnetic particles will be described in greater detail in passages follow.

The actuator member 12 for the present example comprises an electroactive polymer material blended with soft magnetic particles, thereby forming an EAP composite. Soft magnetic particles are to be understood as particles that are reversibly magnetisable by an externally applied magnetic field, and which substantially lose their magnetization (almost immediately) upon removal of the externally applied field. Soft magnetic particles may in particular examples be soft ferromagnetic particles, paramagnetic particles, or superparamagnetic particles for instance.

FIG. 3(a) shows the actuator member 12 in an idle, non-actuated state.

FIG. 3(b) shows the actuator member 12 upon application of a magnetic field 32 to the actuator member by the magnetic field generation means 22. In the present example, the magnetic field generation means is configured to apply a magnetic field having a non-uniform magnetic field strength, and in particular a field which declines in field strength in directions away from the pole of the magnetic field generation means.

As described in the preceding section, upon application of any magnetic field to a soft (para) magnetic material, the material becomes magnetized, acquiring a magnetization with a direction co-oriented with the direction of the applied magnetic field (i.e. with the magnetization of the field source 22). In the present example, each magnetic particle becomes magnetized in a direction co-oriented with the applied magnetic field.

Where the applied magnetic field has a field strength gradient oriented in a direction toward the source of the field, this induces a net attractive magnetic force between the thus magnetized magnetic material and the source of the applied magnetic field. This is because the non-uniform field exhibits a magnitude gradient between the two respective poles of each magnetized particle, thus leading to an imbalance in the attractive and repulsive forces felt respectively at each. The field is stronger at the induced 'south' pole of the particle (at the top, from the perspective of FIG. 3), than at the North pole. Hence the attractive force at the South pole (attracted to the N pole of the magnetic source 22) is stronger than the repulsive force at the North pole (repulsed by the N pole of the magnetic source 22). Hence there is a net attraction toward the magnetic field generation means 22.

As shown in FIG. 3(b), upon application of the magnetic field 32, the thus induced attractive force between the particles and the magnetic field generation means 22 induces a deformation in the actuator member. In particular, a bending 36 is induced in the actuator member in the direction of the magnetic field generation means.

FIG. 3(c) shows the actuator member 12 upon simultaneous application of a magnetic field and an electric field across the thickness 16 of the actuator member. As shown the combination of these two stimuli, induces a similar bending of the actuator member 12, but with an amplitude or magnitude significantly increased compared to that induced through magnetic stimulation alone. Application of the electric field by means of the electrodes 26 induces the electroactive polymer material to deform out of plane (due to the clamps 18). This electrically induced deformation combines with a magnetic deformation to produce an enhanced overall actuation response.

A number of different control modes for the magnetic field generation means will now be described in detail with reference to accompanying figures. Purely by way of clarity, in the figures presented to illustrate these example control modes, the electrical stimulus generation means and controller are not shown. However, for each accompanying figure and example, it is to be understood that the actuator device embodying the described example control mode does in fact comprise said absent features, and that the controller would in all cases be configured to effect one or more deformation patterns by means of coordinated control of both the electronic stimulus generation means and the magnetic field generation means. Co-ordinated control, as explained above, may include synchronous and/or sequential control.

In the example of FIG. 3 soft magnetic particles are provided dispersed substantially homogenously across the actuator member. However, in further examples the magnetic particles may be distributed inhomogeneously. This may in examples enable realization of a non-uniform deformation pattern.

FIG. 4(a) a shows a first example. Here, magnetic particles are locally concentrated in a central region 42, with surrounding regions having no magnetic particles. By consequence, upon activation of the magnetic field 32 only this central region 42 experiences an attractive force toward the magnetic field generation means 22. This induces a more localized form of deformation. In particular, the induced bending or warping may extend or cover only a smaller central section of the actuator member, as opposed to extending evenly across the entire actuator member.

Figure 4:
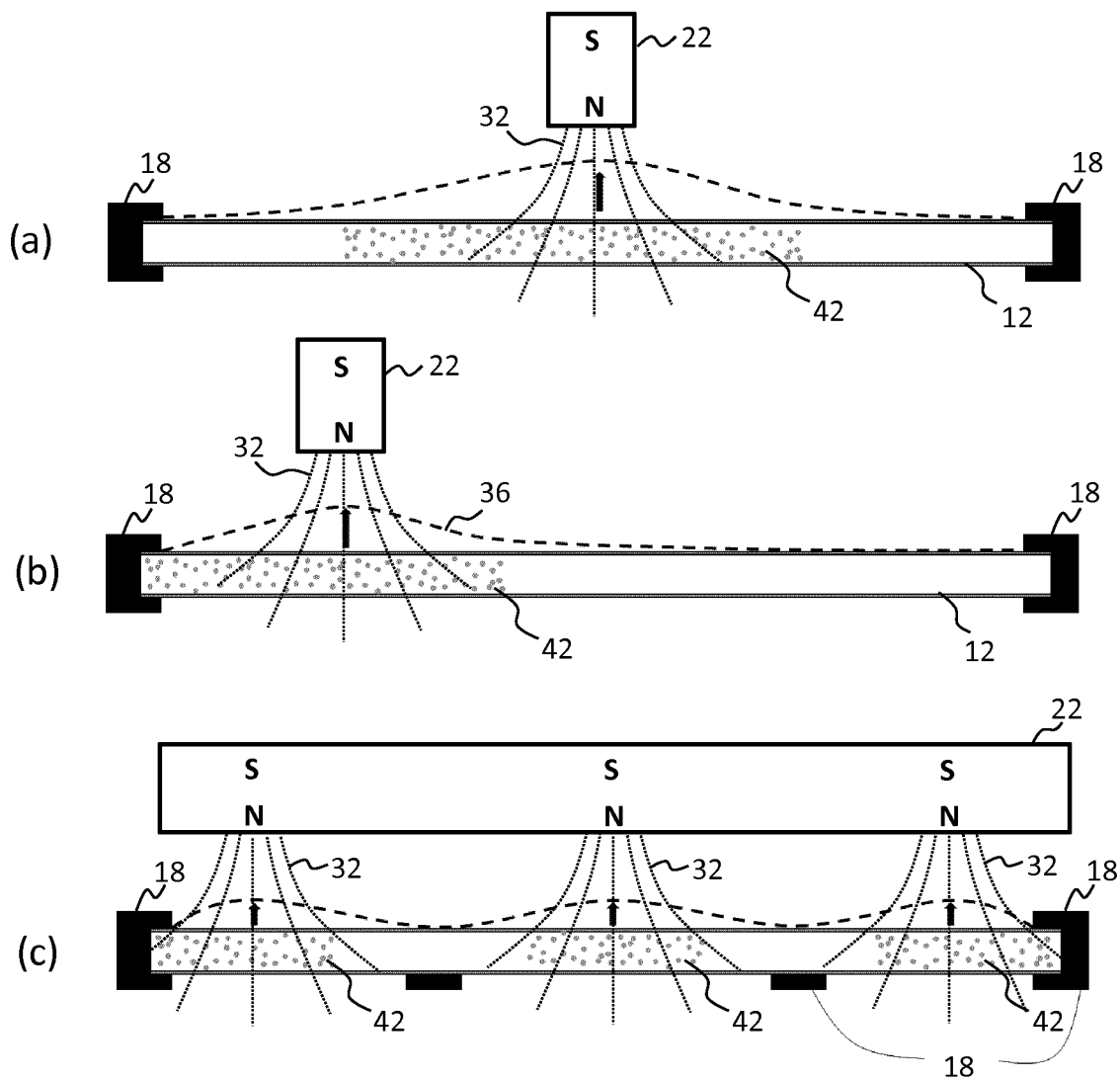
FIG. 4 schematically illustrates a further example actuator device.

Additionally or alternatively, the arrangement of particles shown in FIG. 4(a) enables a bending of the actuator member to be magnetically induced even in the case that a magnetic field is applied homogenously across the entire length of the actuator member 12, as opposed to applied only across a narrow localized region as has been illustrated in the examples of FIG. 3 and FIG. 4.

FIG. 4(b) shows an example actuator member comprising soft magnetic particles focused in a non-central local concentration 42. As shown, this enables stimulation of a deformation in the actuator member being localized in a left-most section of the actuator member. In examples, this might be combined for instance with electrical stimulation of the actuator member using electrodes (not shown) to thereby provide a compound deformation pattern formed of an overall substantially homogenous bending or warping of the actuator member combined with the localized deformation 36 magnetically induced as illustrated in FIG. 4(b).

As in the example of FIG. 4(a), although a localized magnetic field 32 is illustrated in the figure, the example is entirely compatible with a magnetic field applied homogenously across the entire length of the actuator member 12.

Figure 5:
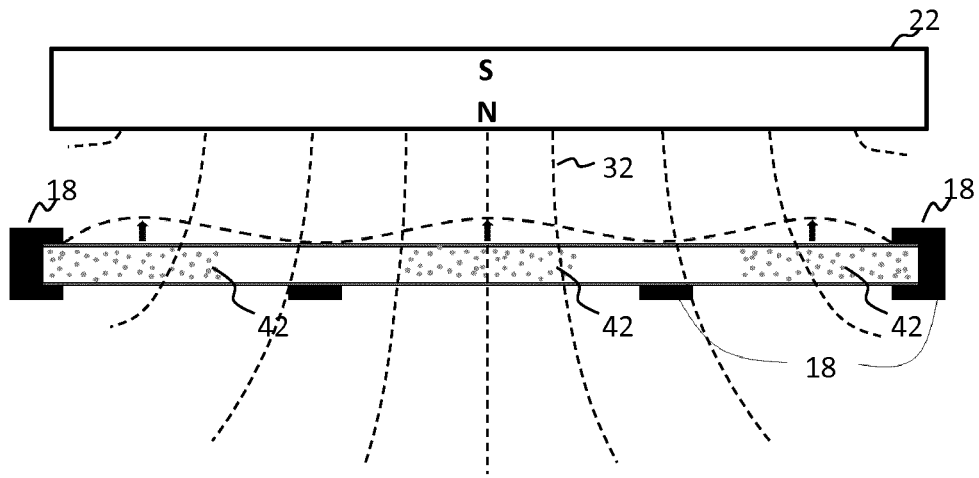

FIG. 4(c) illustrates a further example, comprising magnetic particles being locally concentrated in three evenly spaced regions 42 across the length of the actuator member 12. A respective clamp 18 is provided between each respective local region 42. As shown, a magnetic field generation means 22 is provided being operable to apply a magnetic field extending across each of the respective local regions 42. Separate local magnetic fields 32 may be applied to each respective region (as shown in FIG. 4(c)) or a single magnetic field may be applied evenly across the entire length of the actuator member, covering each of the respective local regions 42. This latter alternative case is illustrated by way of reference in FIG. 5. It is noted that, in this case, convergence may be significantly less than in the arrangement of FIG. 4(c) in which a multiplicity of localized magnetic fields are stimulated.

Upon application of the magnetic field(s) across the three local regions 42, a locally concentrated deformation is induced across each region, thereby inducing a compound deformation pattern consisting of an arrangement of three bumps or protrusions along the length of the actuator member 12. As in the other examples, this may be combined with electrical stimulation of the EAP material in the actuator member, to thereby provide a compound deformation pattern consisting of the three local bumps shown in FIG. 4(c) superposed atop a broader overall bending or warping of the actuator member extending evenly across the entire length of the actuator member.

The three sections may be magnetically stimulated simultaneously, separately, or sequentially in a dynamic fashion for example. Independent stimulation of the sections may require provision of the arrangement of FIG. 4(c) in which a separate local magnetic field is generated for application across each of the three sections. Equivalently, a single magnetic field generation means may be provided being capable of generating a magnetic field having field strength which varies for different sections of the actuator member.

In the embodiments described above, it is assumed that the electroactive polymer matrix has a viscosity such as to prevent the embedded magnetic particles from migrating through the EAP matrix material. The viscosity is such that the magnetic force applied to the particles by the magnetic field generation means 22 is insufficient to overcome the viscous resistance of the polymer matrix. This may typically be the case where the electroactive polymer has a relatively high elastic modulus (e.g. Young's modulus).

Figure 6:
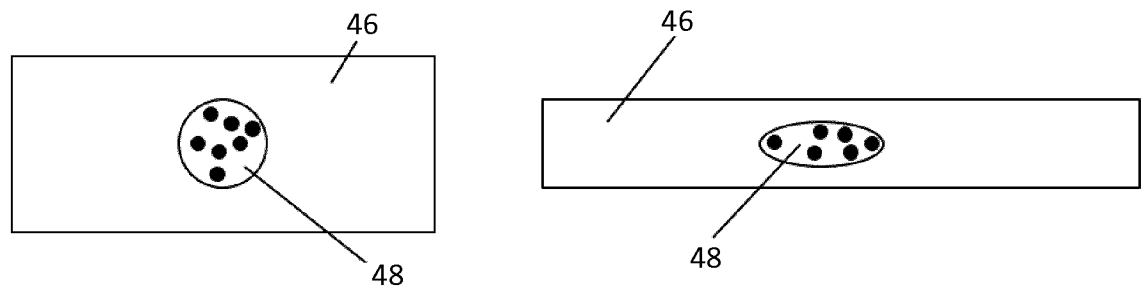
FIG. 6 schematically illustrates magnetic particles suspended in a polymer droplet and dispersed within an EAP matrix.

In accordance with one or more subsets of examples, the magnetic particles may be enclosed in elastically deformable polymer droplets having a viscosity lower than that of the EAP matrix. This is illustrated schematically in FIG. 6 which shows an example region of an actuator member in which magnetic particles are provided suspended in a polymer droplet 48, the droplet being embedded within a surrounding EAP matrix 46.

The polymer droplets are dispersed throughout the EAP matrix, each containing a collection of one or more rigid magnetic particles. Upon electrical stimulation of the EAP (shown on the right of FIG. 6), the polymer droplets follow the induced deformation of the EAP matrix through elastically changing their shape, but do not migrate through the polymer matrix due to their relatively lower viscosity. The two polymers should in particular be immiscible.

The effect of providing the magnetic particles encased within polymer droplets may be the mitigation of resistance against deformation of the EAP matrix. This is because upon deformation of the EAP, the polymer particles are capable of deforming without applying significant resistance to the surrounding EAP. This is in contrast to a system in which magnetic particles are directly embedded within the EAP matrix. In this case, the particles do exert a partial resistance against deformation of the EAP, since EAP molecules must migrate (shear) along the surface of the particles. Shearing against the droplets does also occur, but since the viscosity of these droplets is significantly lower than that of the EAP, the partial resistance against the deformation is less.

As noted above, a broad range of deformation shapes and effects can be realised in accordance with embodiments of the invention through coordinated control of both the magnetic field generation means and the electric field generation means. This may in examples includes activating the two means simultaneously to provide compound actuation patterns. Depending upon the direction of the applied magnetic field, the electrical field effects and magnetic field effects may apply in the same direction or in opposing directions. Where they apply in the same direction, strengthened or augmented deformation responses can be achieved. Where they apply in opposing directions, bidirectional actuation patterns may be achieved, wherein oppositely directed bending may be induced in different sections of the actuator member.

It is noted that where the electrical and magnetic fields are applied simultaneously, it should be ensured, in order to produce deformation responses of enhanced amplitude, that the induced magnetic forces are greater than the electrostatic forces induced by the charged electrodes.

For any of the above-described embodiments, the concentration of the magnetic particles and/or the concentration of the deformable polymer droplets may be varied in order to strengthen or weaken the deformation responses in the actuator member. The concentration of particles may be varied non-uniformly across the actuator member to therefore tune the actuator to provide non-uniform patterns of deformation response.

Examples in accordance with the invention provide EAP actuators with improved performance capabilities. In particular, example actuators in accordance with the present aspect are able to provide greater actuation forces, through combining magnetic and electronically stimulated deformation, and/or are able to provide a broader range of different actuation motions and deformation shapes, through the coordinated employment of both electronic and magnetic stimulation. Deformations induced by each stimulation means may be superposed, or may be controlled in sequential fashion.

By appropriate clamping, actuator members exhibiting different shapes or actuation actions at different regions can be induced. For example, an actuator member having three regions as shown in Fig, 4(c). This may be extended to four, five or any arbitrary number of regions. Each region may be independently controlled through magnetic stimulation. The sections may be controller to stimulate together or sequentially. In accordance with any described example, a plurality of magnetic field generation means 22 may be provided to facilitate independent magnetic stimulation of different regions or section of the actuator member. Magnetic field generation means may be provided on the same side of the actuator member 12 or on different sides to enable application of magnetic fields having different directionalities. By applying fields of different directions to different regions, the different regions may be induced to deform in different direction. Bi-directionality is hence achievable.

Alternative example actuator devices will now be described, with reference to accompanying figures. These examples provide an actuator device including an EAP actuator member having dispersed hard magnetic particles and further including means for applying an electrical stimulus and a magnetic field to the actuator member. A controller is adapted to control these two means in a coordinated manner to thereby realize a program of one or more deformation patterns in the actuator member.

As noted above, the device architecture illustrated in FIG. 3 may be suitably employed in the present alternative set of examples. Although the specific example represented in FIG. 3 comprises soft magnetic particles, replacement of these particles with particles of a hard magnetic material yields an actuator member entirely in accordance with the present aspect. The reader is therefore referred to the description pertaining to FIG. 3 above for a detailed description of the structure of a suitable example actuator device.

The actuator member in accordance with present examples comprises an EAP material having particles of a hard magnetic material dispersed therein. For the purposes of the present document, a hard magnetic material is understood to be a material which is irreversibly magnetized (through prior application of an external magnetic field), and which does not lose its magnetization upon removal of the magnetic field (i.e. it has significant remnant magnetization). Hard magnetic particles may be made, by way of non-limiting example, from ferromagnetic materials such as ferrites, and metals such as SmCo or NdFeB. Other suitable materials for forming hard magnetic particles will be immediately apparent to the skilled reader.

To provide the actuator member having dispersed hard magnetic particles, the hard magnetic particles may be blended with into the electroactive polymer to form an EAP composite. This composite may be used to form the main body of the actuator member 12. To ensure a uniform and consistent magnetization of the actuator member, the magnetic particles require a process of magnetization, which is achieved though application of a strong magnetic field in order to align the magnetic moments of the particles in a uniform direction.

This magnetization may be performed before blending of the particles. However this may lead to clumping of the particles due to inter-particle magnetic attraction. This then renders uniform blending of the particles through the EAP material difficult. More preferably therefore, the magnetization of the particles is performed after blending of the EAP composite, whereupon the particles are already fixed in position within the EAP. The EAP in this case should have a sufficiently high viscosity to prevent migration of the dispersed magnetic particles through the EAP in response to application of magnetic fields.

To magnetize the particles, an external magnetic field is applied to the actuator member, after blending and formation, to align the magnetic moments in a consistent direction. The magnetic field should have a magnetic field strength which is greater than the coercive field strength of the particles. In preferred cases, a homogeneous (i.e. uniform field strength) magnetic field is used to magnetize the particles, since this leads to a more uniform magnetization across the whole of the actuator member (since the same magnetic field strength is experienced at every point). However, a magnetization using a magnetic field of non-uniform field strength may also be considered, in the case that the applied magnetic field strength is sufficiently high as to bring the particles into magnetic saturation.

In accordance with one or more examples, an intentionally non-uniform magnetic field may be applied to the actuator member in magnetizing it, in order to induce a non-uniform pattern of magnetization across the member. By providing non-uniform magnetization, the actuation behavior of the actuator member may be varied. In particular, the deformation response of a particular region is dependent upon the magnitude of the local magnetization. By varying the strength of magnetization across different regions, different regions may respond by greater or lesser amounts to application of a uniform magnetic field. This may enable creation of interesting and complex deformation patterns in response to a simple application of uniform field.

In particular examples, some regions may be left unmagnetised, while others are uniformly magnetized. This may provide a hinged or jointed deformation response, wherein an applied magnetic field causes magnetized regions to deform about or around unmagnetised regions. Areas of magnetized particles may in examples be separated by areas of non-magnetized particles. In accordance with one or more examples, different areas of the actuator member may be provided magnetizations of different polarities or directionalities, with two neighboring regions being oppositely magnetized for instance.

As noted, the basic structure of an actuator device in accordance with presently described examples may be understood from the illustration of FIG. 3 above. However, control modes for stimulating deformation patterns in the actuator member (by magnetic and electronic means) may generally differ from those utilized in examples comprising soft magnetic particles. Modes and means for controlling actuator members in accordance with present examples will now be described in detail.

Figure 7:
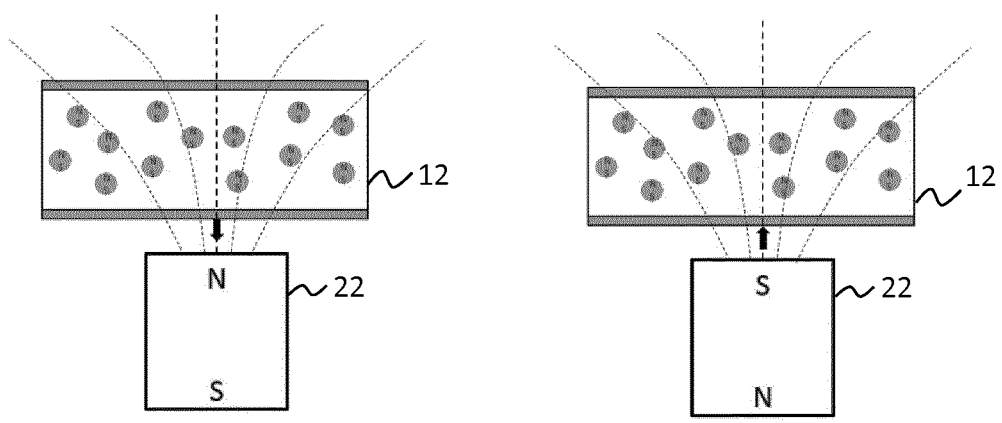
FIG. 7 schematically illustrates a section of an example actuator member.

FIG. 7 schematically illustrates a simple first means for magnetically manipulating an example actuator member 12. The figure shows a small section of an example actuator member 12 having dispersed hard magnetic particles. The particles are uniformly aligned to imbue the actuator member with an overall magnetization in an upwards direction (from the perspective of FIG. 7). Since the particles have a permanent remnant magnetization which is not dependent upon continued application of a magnetic field (unlike in embodiments described above), in present examples it is possible to control the actuator member to deform in different desired directions through controlling the directionality of the applied magnetic field.

This is illustrated in the two configurations shown in FIG. 7. In the left hand configuration, a magnetic field generation means 22 is controlled to apply a magnetic field (of non-uniform field strength) having a magnetization co-oriented with the magnetization of the particles dispersed in the actuator member 12. In this case, the applied field exerts an attractive force upon the particles (i.e. in the direction of the magnetic field generation means 22). The viscosity of the electroactive polymer is, in accordance with this example, sufficiently high to prevent migration of particles through the polymer matrix. As a consequence, the attractive force exerted by the applied magnetic field induces a bending of the actuator member in the direction toward the magnetic field generation means 22.

In the right-hand configuration of FIG. 7, the magnetic field generation means 22 is controlled or configured to apply a magnetic field of non-uniform field strength having a magnetization oppositely oriented with respect to the magnetization of the particles within the actuator member 12. In this case the applied field exerts a repulsive force upon the particles (i.e. in a direction away from the magnetic field generation means 22). As a consequence, application of this magnetic field leads to a bending of at least the shown section of the actuator member 12 in a direction away from the magnetic field generation means 22.

It can therefore be seen that by controlling the direction of an applied magnetic field, it is possible to control the direction of bending (or other form of deformation) which is induced in one or more sections of an example actuator member 12.

In both cases, a magnetic field of non-uniform field strength is applied. The field in particular declines in field strength in directions away from the magnetic field generation means 22. The magnetic force exerted upon a magnetized body by an external magnetic field may in general be given by the relation $\underline{F} = \nabla(\underline{m} \cdot \underline{B})$ (i.e. grad ($\underline{m} \cdot \underline{B}$)). Where the magnetic field declines in field strength as a function of increasing distance from the magnetic field generation means, this results in a positive gradient of $\underline{m} \cdot \underline{B}$ (assuming uniform magnetization across the actuator member) in directions toward the magnetic field generation means. The particular direction of the magnetic force exerted upon the magnetic particles will depend in each case upon the direction of the applied magnetic field relative to the direction of the magnetization of the particles.

Where the magnetic field generation means is small, or at least where the magnetic field generation means is capable of generating fields which are contained or limited in their spatial span, locally focused deformation of the actuator member can be achieved.

Figure 8:
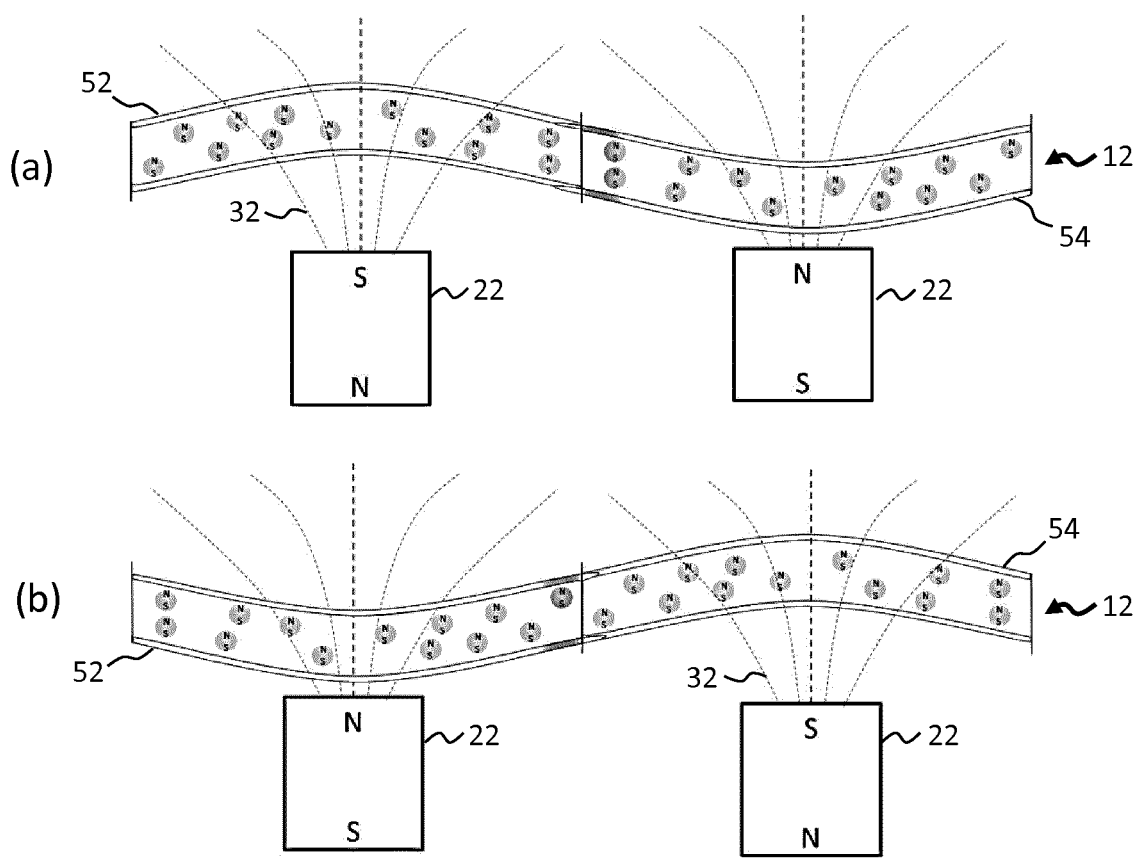
FIG. 8 schematically illustrates an example actuator member.

This concept is illustrated schematically in FIG. 8. The actuator member 12 in this example is prepared having a uniform magnetization across its entire length, with the direction of magnetization in each section 52, 54 of the actuator member being the same.

In FIG. 8(a), a first magnetic field generation means 22 applies a magnetic field 32 across a first section 52 of the actuator member 12 in a direction opposite to the magnetization of the particles, and a second magnetic field generation means 22 applies magnetic field 32 across second section 54 of the actuator member in a direction co-oriented with the magnetization of the particles. As a consequence, the particles in the first section 52 experience a repulsive force, deforming the first section away from the first field generation means, and the particles in the second section 54 experience an attractive force, deforming the second section toward the second field generation means. This results in a wave-like or undulating deformation pattern in the actuator member.

FIG. 8(b) shows a similar control scheme, wherein the directionality the two magnetic fields has been reversed, such that the first section 52 is deformed downwards and the second section 54 is deformed upwards.

By recurrently switching the directionalities of the two magnetic field generation means 22 as a function of time, a dynamic wave-like or wiggling deformation effect may be achieved.

In addition to changing the directionalities of the two magnetic fields, the strengths of the two fields may also be varied, either as a function of time or statically to achieve different degrees of deformation in each of the two neighboring sections. As a result, an almost unlimited range of different bidirectional deformation patterns are achievable.

Furthermore, although only two sections are illustrated in FIG. 8, the skilled person will readily appreciate that the concept may be extended to an actuator member comprising any number of different sections, each being provided with independently controllable magnetic field. This may either be facilitated by providing independent magnetic field generation means for each section or by providing a magnetic field generation means capable of generating a field having different strengths at different lateral locations.

When extended to large numbers of independently controllable sections, for example 10 or more, it is possible to generate a travelling wave pattern along the actuator member through sequential activation of the magnetic fields for each consecutive section. Such a travelling wave may advantageously be used for example to create a fluid flow for example over the actuator member. This could for instance be used as a pump. Undulating deformation modes of this sort are particularly useful for instance in micro fluidic systems to propel or move fluid.

Figure 9:
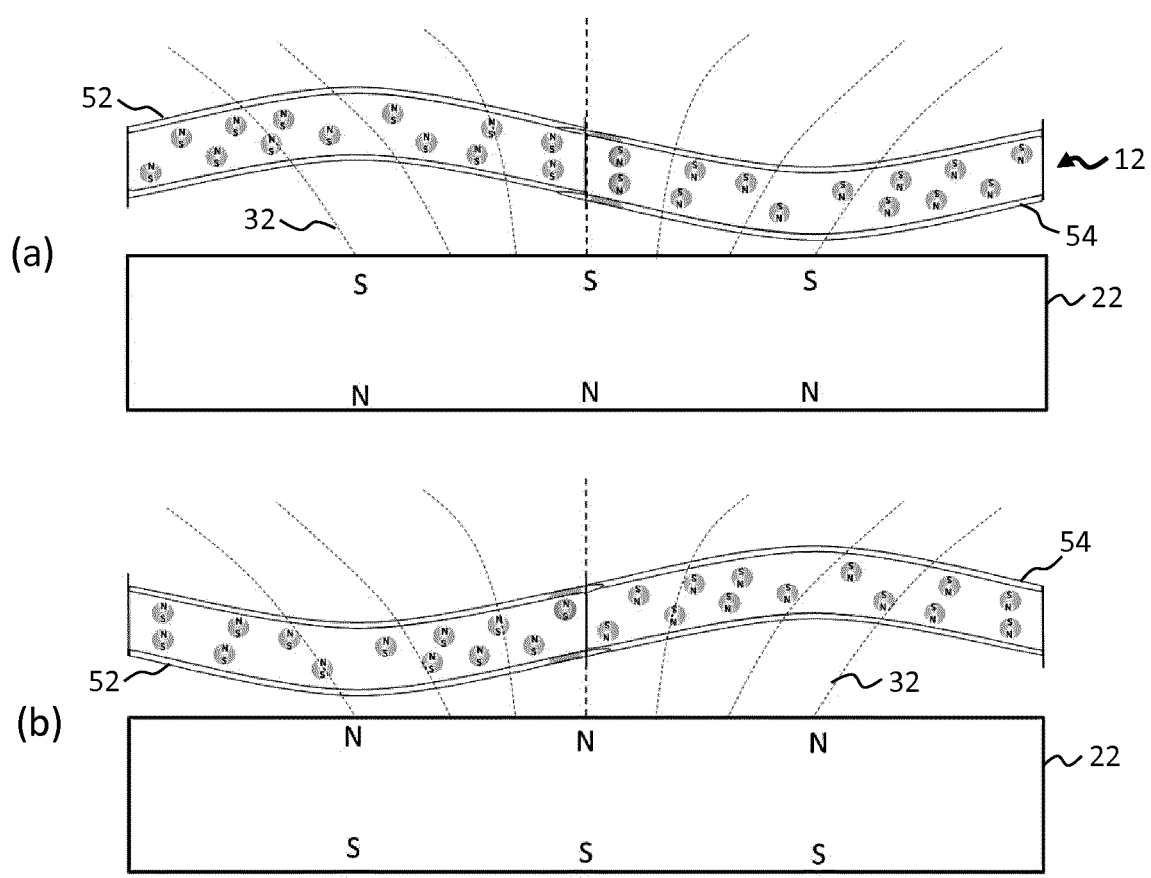
FIG. 9 schematically illustrates a further example actuator member.

FIG. 9 illustrates a variation on the example control mode of FIG. 8, wherein a (laterally) uniform magnetic field is applied across the actuator member, and wherein particles dispersed in two neighboring sections 52, 54 have respectively differently oriented magnetizations. As a result, upon application of the laterally uniform magnetic field 32, each of the two neighboring sections 52, 54 of the actuator member 12 deforms in a different respective direction.

As shown in FIG. 9(b), by switching the directionality of the applied magnetic field 32, the respective deformation directions of the two neighboring sections 52, 54 can be reversed. The dynamic undulating motion achieved in the example of FIG. 8 is therefore also achievable in this example by recurrently switching the directionality of the single laterally uniform magnetic field 32.

Further deformation effects are also achievable in accordance with examples through provision of a non-uniform distribution of particles within the electroactive polymer matrix of the actuator member 12. These achievable effects mirror those illustrated and described above with reference to the examples of FIG. 4. By arranging the magnetic particles in local concentrations, localized deformation effects are realizable.

With reference to FIG. 4, by concentrating the hard magnetic particles in a central region 42, a centrally localized bending or deformation is realizable. Additionally, the polarity of the applied magnetic field 32 may be reversed in accordance with examples, to thereby achieve different directions of bending of this central section 42 of the actuator member. The magnetic field direction could be reversed recurrently to thereby achieve oscillatory motion for instance. The same principle is applicable with respect to a non-central section 42 as shown in FIG. 4(b).

Additionally or alternatively, as illustrated in FIG. 4(c), localized deformation can be realised across an array of local regions 42, by providing a plurality local concentrations of particles. By providing clamps between each of the neighboring regions, the local deformation effect may be enhanced. Additionally, in accordance with examples, the directionality of bending of each individual section may be independently controlled through changing the direction of the applied magnetic field at the given region. As a result, a broad range of different deformation patterns is achievable.

In describing examples above, only control for magnetic deformation of the actuator member has been described in detail. However it is to be understood that in implementation of any of the present examples, magnetic deformation effects are applied in concert, or in complementarity, with electrically induced deformation effects. As shown in FIG. 3, in examples, a pair of electrodes may be provided, affixed to opposing major surfaces of the actuator member, for applying an electrical stimulus to the electroactive polymer in the form of an applied electric field.

Electrically induced deformations may be applied simultaneously with magnetically induced deformations, or the controller 30 may be configured to implement coordinated sequential control of the two stimuli, to achieve complex static or time varying deformation patterns. In all cases, coordinated control of the two stimulation means (electronic and magnetic) enables a significantly enhanced range and breadth of different deformation actions, shapes and effects.

In accordance with any embodiment of the invention described above, or in accordance with the further examples detailed above, the magnetic particles may be magnetostrictive particles. Magnetostrictive particles are characterized in transducing or converting magnetic energy to mechanical energy and vice versa. Upon magnetization of a magnetostrictive material, the material exhibits a strain, i.e. a change in its length per unit length. Conversely, an externally induced strain in a magnetic material (i.e. induced through application of an external force) will results in a change in the magnetic state of the material, thereby inducing a change in the magnetic field exhibited across the material. This bidirectional coupling between the magnetic and mechanical states of magnetostrictive materials provides a transduction capability that may be used for both actuation and sensing of shape change.

Magnetostrictive particles may be formed of soft magnetic materials or hard magnetic materials, and hence the examples described below are compatible with application to any embodiment of the invention, or any example described above.

Figure 10:
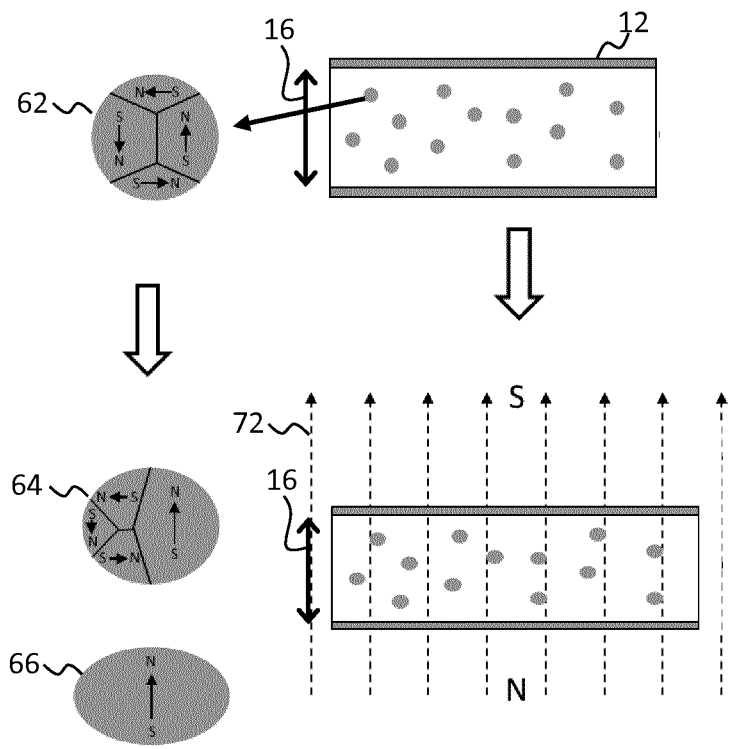
FIG. 10 schematically illustrates an example actuator member comprising magnetostrictive particles.

A simple example of magnetically induced deformation using magnetostrictive particles is illustrated in FIG. 10. An example actuator member 12 comprises an electroactive polymer material having magnetostrictive particles distributed therein.

The upper image shows the actuator member 12 in an idle state before application of a magnetic field. The magnetic properties of an example magnetic particle 62 in this first state are schematically illustrated. The example particle is depicted comprising an exemplary set of magnetic domains, each comprising magnetic dipoles having a different relative alignment. Although only four domains are shown, containing particles aligned in four exactly perpendicular orientations, this is by way of schematic illustration only, and in reality there may be more, and usually there will be a very large number of, (mostly microscopic) domains within a particle, containing dipoles aligned in different directions.

In the absence of any applied magnetic field (as in the case of particle 62), the magnetic dipoles across the different domains have random directions such that, at a macroscopic scale, the dipole moments cancel out and each particle exhibits a zero net magnetization.

The lower image of FIG. 10 shows the actuator member upon application of a homogenous magnetic field (i.e. a magnetic field having magnetic field strength which is uniform across the extent of the actuator member and which does not vary as a function of position). The homogenous magnetic field is applied by means of a suitable magnetic field generation means (not shown) such as a controllable electromagnet or other coil or solenoid.

Under the influence of the applied magnetic field, the magnetic dipoles of the different magnetostrictive particle magnetic domains begin to align in a common direction (parallel with the applied field). Particle 64 schematically represents the magnetic domains of an example particle upon application of a low strength magnetic field, and particle 66 represents the domains upon application of a high strength magnetic field, at which point the dipoles of all domains within the particle have aligned, leaving effectively in a single homogenous domain of dipoles all of which are aligned in a common direction.

When any homogenous magnetic field is applied to such an actuator member 12, no attractive or repulsive force is experienced, but the magnetostrictive particles undergo a shape change in response to the applied field. In particular, the volume of the magnetostrictive particles changes. Assuming particles which are spherical in a non-stimulated state, application of the magnetic field causes particle to deform slightly into an ellipsoid shape. On the macro scale, this may be used to provide a small actuation, but having higher force.

Depending upon the particular type of magnetostrictive material, either a length increase or a length decrease is obtained in the actuator member upon application of a magnetic field. In particular, depending upon the material, one of two different kinds of magnetostrictive effect may be achieved: positive magnetostrictive effect or negative magnetostrictive effect. These different effects have different associated deformation responses to application of a given magnetic field.

In the example of FIG. 10, particles of a negative magnetic material are illustrated. Application of a vertically aligned magnetic field results in a horizontally aligned deformation (or compression) of the particles. This results in an overall reduction in the thickness 16 of the actuator member.

It is noted that this deformation response is achievable using either a homogenous or inhomogeneous magnetic field. These examples therefore differ from those described above (relating to use of non-magnetostrictive particles), where magnetically stimulated actuation is only achievable upon application of an inhomogeneous magnetic field.

In the particular example of FIG. 10, a homogenous magnetic field 72 is applied to the actuator member 12, thereby inducing a volume change in the magnetic particles. Depending upon the material type, a length increase or a length decrease in the actuator member may be achieved. In the particular example of FIG. 10, a length increase is illustrated. By consequence, the electroactive polymer matrix of the actuator member will expand in a direction perpendicular to the thickness 16 of the actuator member. This expansion may be utilized to provide an actuation force of small amplitude but high force.

As noted above, the deformation response of an example particle to application of a low strength magnetic field is shown in 64. As can be seen, there is a slight expansion of the particle in a lateral direction.

In further examples, a magnetostrictive material may be used which is adapted to shrink under the influence of the magnetic field. In this case, the electroactive polymer matrix will correspondingly contract, again with small amplitude but high force. Combination of both these kinds of material within a single actuator member may in examples enable bidirectional drive, wherein different sections of an actuator member may either expand or contract respectively.

In accordance with one or more further examples, the magnetostrictive particles may be distributed non-uniformly through the actuator member to thereby provide a set of local concentrations of magnetic particles. This may enable effects similar to those described in relation to the example of FIG. 4, wherein localized deformation effects are achievable. For instance, by concentrating particles in a set of three distinct concentrations as in FIG. 4(c), different expansion or contraction effects may be stimulated in each of said localized regions 42. In particular, in regions with a high concentration of particles, any expansion or contraction of the polymer matrix will be larger and hence local deformation effects will occur. Heterogeneity of particles in the electroactive polymer blend may be introduced by design to create any desired deformation configuration.

In accordance with one or more further examples, a uniform or non-uniform distribution of particles may be utilized in combination with a structured magnetic field to thereby achieve different deformation effects in different local regions of the actuator member. In particular, the structured magnetic field may have different field strengths or directions at different local regions to thereby realize the locally varying deformation effects.

Use of magnetostrictive particles may advantageously be combined with any described embodiment of the invention or any example outlined above.

A further set of examples relates to sensing of changes in a shape of an EAP actuator member through monitoring the magnetic properties of magnetic particles dispersed within the EAP.

In accordance with these examples, there is provided an actuator device including an EAP actuator member having embedded magnetic particles and further including a magnetic field sensor for detecting the strength of a magnetic field within or proximal to the body of the actuator member. A controller is configured to determine based on outputs from the magnetic field sensor an indication of a change in shape of the actuator member. In particular embodiments, the determined change in shape may be used as feedback in controlling the deformation pattern of the actuator member.

The controller in accordance with at least one set of embodiments is in particular adapted to determine an indication of a change in thickness of the actuator member. The actuator member may for example have a layer like structure comprising opposing major surfaces. In this case, thickness is to be understood as the dimension of the actuator member extending between the two major surfaces, in a direction normal to each. However more generally, the thickness may refer to any arbitrary dimension of the actuator member, but may more typically refer to a smaller, or the smallest, of the three dimensions of any actuator member provided in accordance with the presently described examples.

Although particular examples will be described below which relate in particular to measurement of a change in thickness of the actuator member, it is to be understood that in further examples, similar concepts may readily be applied to determination of other aspects of a shape change. These may, by way of non-limiting example, include changes in width, height or length of the actuator member, or changes in curvature or topology of the actuator member. Shape changes may in further examples include changes in the overall profile or contour of the actuator member.

The concept may be applied to actuator members comprising hard magnetic particles, soft magnetic particles and/or magnetostrictive particles. Particular examples pertaining to each of these cases will now be described in detail.

Figure 11:
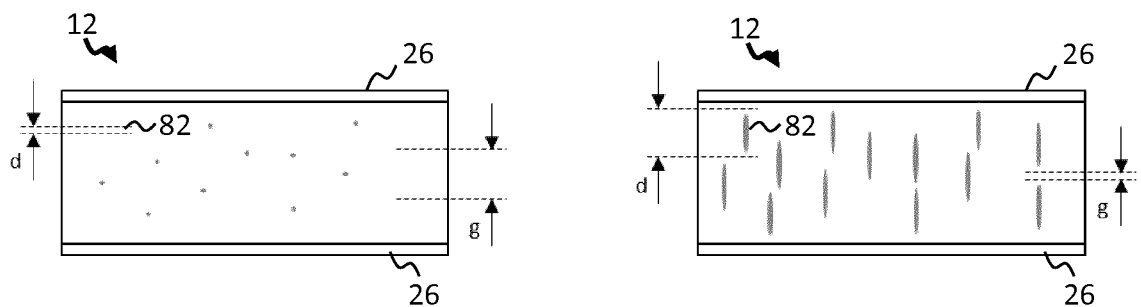
FIG. 11 schematically illustrates an example actuator member comprising soft magnetic particles.
Figure 12:
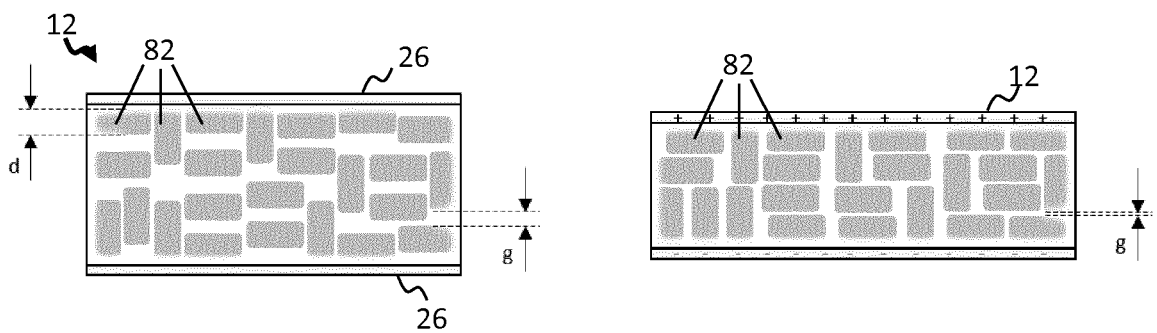
FIG. 12 schematically illustrates a further example actuator member comprising soft magnetic particles.
Figure 13:
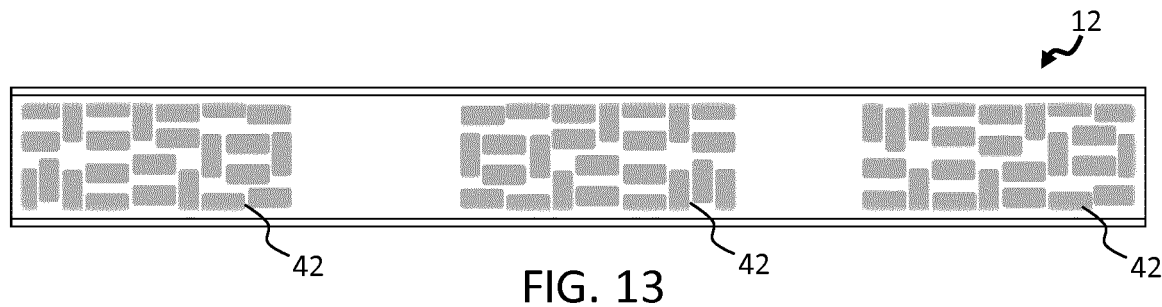
FIG. 13 schematically illustrates a further example actuator member comprising soft magnetic particles.

The concept as applied to an example actuator member comprising dispersed soft magnetic particles is illustrated in FIGS. 11 to 13. The concept is based in this case upon monitoring the magnetic permeability of the actuator member comprising the dispersed soft magnetic particles.

For particles with a high magnetic permeability, such as ferrite particles (where the permeability can easily exceed 1000), the magnetic permeability (μ) of the electroactive polymer composite may be taken to be proportional to:

$$\mu = \alpha N d / \langle g \rangle \quad (1)$$

where α is a proportionality parameter, N is the number of particles per surface area perpendicular to the thickness of the actuator member (where thickness is understood in the sense described in the preceding section), d is the average dimension of each particle parallel with the thickness of the actuator member, and $\langle g \rangle$ is the average inter-distance between magnetic particles of the actuator member in a direction parallel with the thickness.

In the case that the length of the dispersed magnetic particles d is increased in a direction parallel with the thickness of the actuator member (i.e. to impart them with a non-equal aspect ratio), the overall magnitude of the exhibited magnetic permeability for any given $\langle g \rangle$ is significantly increased. This is illustrated schematically in FIG. 11 which shows an example actuator member 12 having dispersed magnetic particles. In the left-hand image, the particles are substantially symmetric in height and width dimensions, having a small d 82 and a large gap distance $\langle g \rangle$.

The right-hand image shows the actuator member with particles having a significantly expanded height dimension d 82, and wherein the inter-distance gap $\langle g \rangle$ has significantly reduced as a consequence. By consequence of these changes, the magnetic permeability μ increases by a factor of a hundred. These numbers are provided by way of illustration only and any equivalent adaptation of the particles to provide increased height dimension d is equally applicable.

Provision of these height extended ellipsoidal particles may be achieved through any of a range of well-known processes, and means for forming such particles would be immediately apparent to the skilled person (in particular to any colloid chemist).

The uniform alignment of the particles shown in FIG. 11 may be achieved in examples by applying a relatively large, homogeneous magnetic field to the actuator member 12 while increasing its temperature to thereby decrease the viscous resistance forces of the electroactive polymer matrix. An inhomogeneous field might also be used to align the particles. However, this would result in exertion of a net translational force upon the particles, causing disruption of the distribution of the particles within the EAP matrix. Use of a homogeneous magnetic field avoids this difficulty.

Once the required alignment is achieved, the temperature may once again be reduced to fix the particles in place, and the applied magnetic field removed.

When considering particles of a material having a high intrinsic magnetic permeability, the effective permeability of the actuator member 12 is approximately proportional to $d/\langle g \rangle$. When the particles have been appropriately aligned, as in the right-hand image of FIG. 11, the inter-spatial gap $\langle g \rangle$ is typically significantly smaller than the particle 'height' dimension d. A typical value for the ratio d:g may for instance be 10:1. As a result, the effective magnetic permeability of the actuator member in an idle, un-actuated state may be approximately proportional to $\mu = \alpha * N * 10$.

When a voltage is applied between the electrodes 26 (disposed on opposing major surfaces of the actuator member), an electric field is established across the actuator member 12, thereby stimulating a decrease in the thickness of the actuator member. In the case that the magnetic particles are harder than the electroactive polymer matrix, this compression in thickness forces the particles closer together, thereby reducing the average interspatial distance $\langle g \rangle$.

This is illustrated schematically in FIG. 12 which shows an example actuator member 12 having a plurality of dispersed soft magnetic particles 82. Upon application of an electric field between the electrodes 26, the actuator member is induced to contract in thickness, thereby resulting in the actuated state shown in the right-hand image of FIG. 12. As shown, the inter-spatial gap d between the particles is significantly reduced.

In particular, if the gap is reduced to half its size, the permeability μ will double, so that it may be approximately proportional to $\mu = \alpha * N * 20$. If the gap is reduced to one tenth of its original size, the permeability will increase by a factor of 10, so that it may be approximately proportional to $\alpha * N * 100$. Should the compression of the member 12 be large enough that the gap between the particles is completely closed (i.e. the EAP between the particles is entirely squeezed out leaving zero gap between the particles), the permeability will revert to the intrinsic permeability of the particles, such that it is approximately proportional to $\mu = \alpha * N * \mu_{intrinsic}$. As stated above, this could in some cases be a value in excess of 1000.

Hence, changes in the thickness of the actuator member (whether through electrically induced deformation or otherwise) translate directly into measurable changes in the exhibited magnetic permeability of the actuator member. Where the structure of the actuator member is in accordance with the examples of FIGS. 11 and 12, small changes in the thickness result in large changes in the exhibited magnetic permeability (for instance changes by orders of magnitude).

Hence, by measuring changes in the magnetic permeability of the actuator member 12, changes in thickness can be quantitatively derived.

The magnetic permeability of the actuator member may be measured in examples by means of a further provided magnetic sensor, for instance a magnetic recording head or a hall sensor. In examples, the actuator device may further comprise a magnetic field generation means for applying a small (for instance homogenous) magnetic field across the actuator member, and wherein the magnetic permeability is measured by measuring changes in the exhibited auxiliary field across the actuator member (i.e. using the general relation B=μH). By applying a homogenous magnetic field, this sensing functionality might be provided without interfering with any magnetically induced deformation of the actuator member using a non-homogeneous magnetic field. In this way, thickness sensing described herein may be advantageously incorporated into any of the example actuator embodiments described in relation to the invention above.

The actuator device of FIG. 12 may further comprise a controller (not shown) to which the magnetic sensor (and optionally the magnetic field generation means) may be operatively coupled. The controller may be configured to control the sensor to monitor the magnetic permeability of the actuator member or to monitor the magnetic field strength across the actuator member. Based on a measured magnetic field strength, the controller may be configured to calculate a change in, or an absolute value of, the magnetic permeability across the actuator member.

In examples, the measured or determined magnetic permeability (or magnetic permeability change) may be converted into a corresponding thickness change using a stored lookup table. The lookup table may be stored in a memory comprised by the actuator device, for example comprised by the controller. The lookup table may store associated thickness change values known to correspond to a range of different possible measured or determined permeability values. Alternatively, changes in thickness may be calculated by the controller using a theoretical relationship.

In particular examples, the measured magnetic permeability value or determined thickness change values may be used by the controller in controlling the magnetic and/or electrical stimulation of the actuator member. In this way, the measured changes in member thickness may be used to inform control over the actuation extent or shape of the actuator member. The sensing functionalities described above may hence be used as a form of direct feedback in controlling deformation of the actuator member.

In accordance with one or more examples, the magnetic particles may be distributed non-uniformly through the actuator member 12. An example is illustrated schematically in FIG. 13, which shows an actuator member comprising three spatially separated local concentrations 42 of soft magnetic particles distributed across the EAP matrix of the actuator member. By providing heterogeneity of particles as shown, sensing of actuator thickness at different local sections of the actuator member may be enabled. In particular, a separate dedicated magnetic sensor may be provided for sensing a magnetic field or magnetic permeability across each local concentration 42. In this way, independent local measures of magnetic permeability, and hence thickness change may be achieved.

Figure 14:
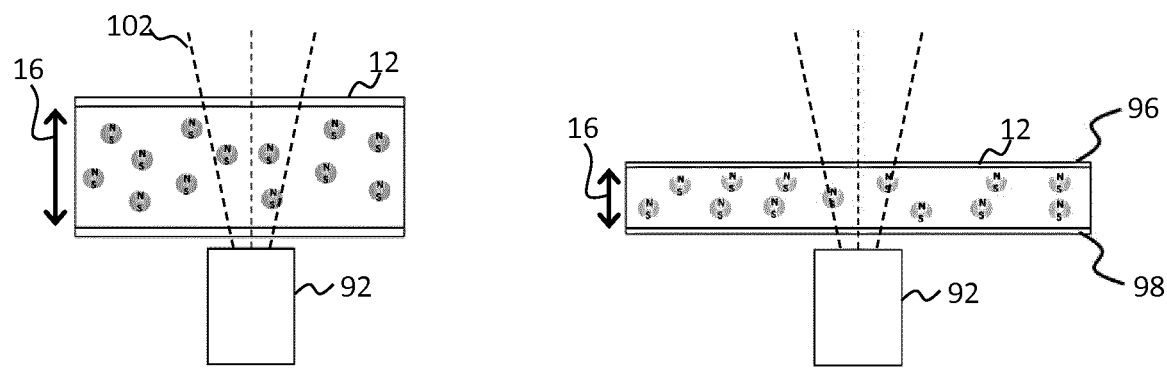
FIG. 14 schematically illustrates an example actuator member comprising hard magnetic particles.
Figure 15:
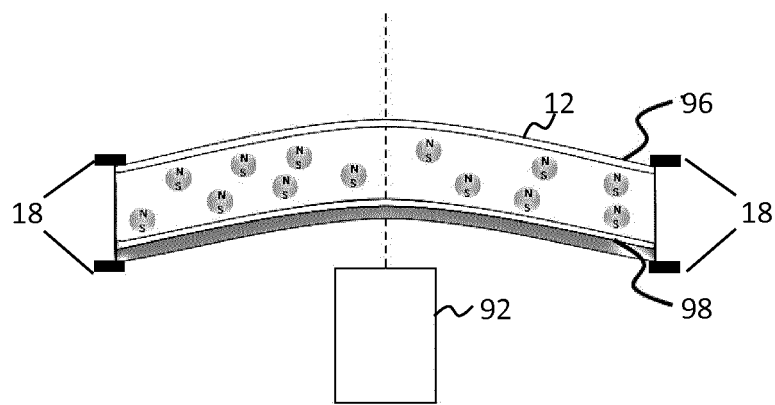
FIG. 15 schematically illustrates an example actuator member comprising hard magnetic particles.

The concept as applied to an example actuator member comprising dispersed hard magnetic particles is illustrated in FIGS. 14 and 15. The concept is based in this case upon monitoring the strength of magnetization exhibited across a limited lateral stretch of the actuator member. As the thickness changes, the volume per surface area of the actuator member changes, thereby altering the number of permanent magnetized particles contributing to the magnetization across any fixed length. This can be sensed by an accompanying magnetic field sensor and used to provide an indication of an extent of any change in thickness.

A simple example of this embodiment is illustrated in FIG. 14. The left-hand image shows an example actuator member 12 having dispersed hard magnetic particles in an inactive (non-actuated) state. The right-hand image shows the actuator member upon application of an electric field across its thickness 16, between electrodes 96, 98. The electric field stimulates the EAP material of the actuator member to deform, thereby leading to a reduction in the thickness.

Arranged proximal to the actuator member 12 is a magnetic field sensor 92, operable to monitor or measure a magnetic field strength at a location within or proximal to the actuator member.

As illustrated schematically in FIG. 14, upon electrical stimulation of the actuator member 12, the number of magnetic particles situated within a sensing region 102 of the magnetic sensor 92 decreases. As a result, the total magnetic field strength exhibited by this particular lateral section of the actuator member decreases in a measurable way. By monitoring changes in the magnetic field strength sensed by the magnetic field sensor 92, changes in the thickness of the actuator member may be detected and monitored.

The magnetic field sensor 92 may be operatively coupled to a controller (not shown in FIG. 14), the controller being configured to determine, based on the sensed magnetic field strengths, indications of any change in the thickness of the actuator member. This may in particular examples be achieved by means of a pre-determined lookup table stored within a local memory of the controller, or accessible to the controller, storing actuator member thickness values correlated with each of a set of measured magnetic field strengths. These values may for example be derived experimentally for each particular actuator member, or may be standard values known to pertain to all actuator members of a particular specification. Thickness change values might alternatively be determined by the controller based on a known theoretical relation.

The determined changes in the thickness of the actuator member may in the presently described examples be used to provide displacement feedback for controlling the actuator 12. In examples, a control loop might be established, wherein the thickness measurements provide direct or indirect feedback to inform the controller in controlling the electrical stimulation of the actuator member. For instance, via the pre-determined lookup table or otherwise, the controller may be configured to increase the electrical voltage applied between the electrodes 96, 98 until a desired thickness is reached, whereupon the voltage is levelled off to a constant value.

The exact relation between actuator thickness and change in the sensed magnetic field strength depends of a variety of factors: the number of permanent particles sensed by the magnetic field sensor 92, the distance of these particles to the sensor, and also the particular shape of deformation induced by actuation of the actuator—for instance, a bending of the actuator may lead to a voltage-dependent change in the average distance between the magnetic particles and the sensor.

This is illustrated schematically in FIG. 15, which shows an example actuator member 12 having dispersed hard magnetic particles, and being clamped at either end by a set of clamps 18. As the actuator member is electrically stimulated, a bending is induced due to the clamping, which results in an increase in the distance between the magnetic particles and the magnetic field sensor 92. This may typically lead to a reduction in the sensed magnetic field strength. To account for this, the controller may be configured to compensate in a predetermined way for expected changes in field strength occurring as a result of electrical deformation. To facilitate this, the controller may be operatively coupled to both the electrodes 96, 98 and the magnetic field sensor, such that it can be known at any time the particular voltage being applied to the actuator member. This may then be used in calculating a compensated field strength value.

For any of the present examples, the electrical and magnetic actuation effects may be tuned in a quantitative by varying the magnetic particle concentration, the particle diameter, and/or the particle shape.

Figure 16:
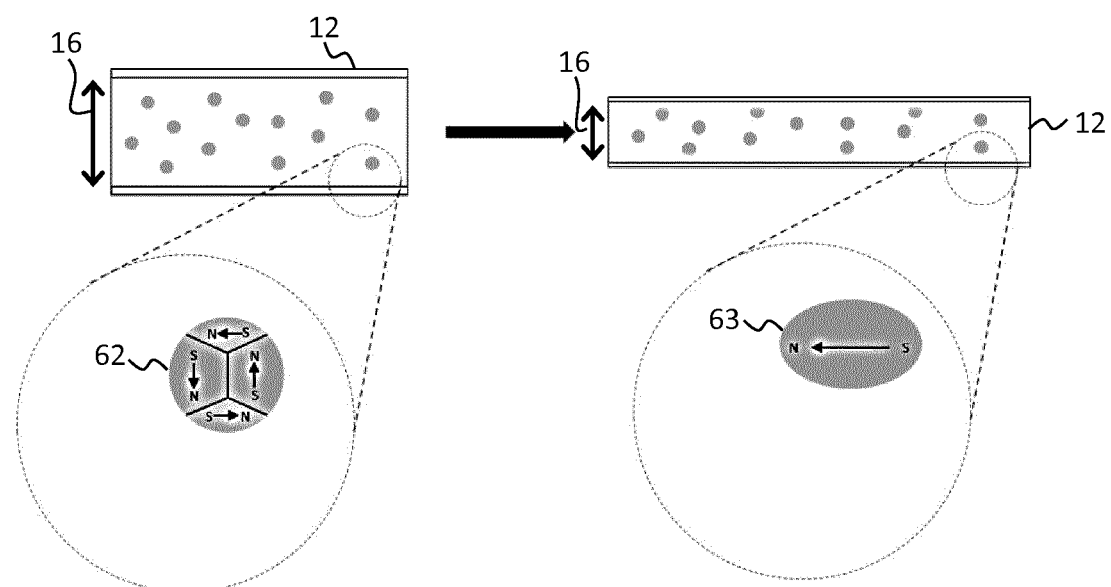
FIG. 16 schematically illustrates an example actuator member comprising magnetostrictive particles.

The concept as applied to an example actuator member comprising dispersed magnetostrictive particles is illustrated schematically in FIG. 16. The concept in this case is also based upon monitoring the strength of magnetization exhibited by the magnetic particles in the actuator member. Upon electrical stimulation of the actuator member and consequent deformation, stresses are induced within the EAP matrix of a magnitude dependent upon the strain induced in the actuator member by the deformation. These stresses are in turn applied to the magnetostrictive particles. As discussed above, magnetostrictive particles have the property of changing their magnetization in a predictable manner in response to applied stresses. It can hence be seen that by monitoring the exhibited magnetization across at least a section of the actuator member, the change in thickness of the actuator member (i.e. a component of the induced strain) can be determined and monitored.

An example is illustrated schematically in FIG. 16, which shows an example actuator member 12 formed of an electroactive polymer material having magnetostrictive particles dispersed therein. The left-hand image shows the actuator member in an initial, un-actuated state. The magnetic properties of one example magnetic particle is schematically illustrated by 62, which shows that, in this initial state, the particles have zero net magnetization (the magnetic dipoles are aligned in random directions). Upon deformation of the actuator member, the shape of the magnetic particles becomes deformed, changing from the more spherical shape in 62, to the more ellipsoidal shape of 63. As a result, the particle is induced to acquire a net magnetization (as shown in 63). For the present example, the particles are assumed to be of a positive magnetostrictive material. As a result, the particles respond to the horizontally aligned deformation of the actuator member with a corresponding horizontally aligned magnetization (in, for the present example, a direction from right to left, from the perspective of FIG. 16). To the direction of magnetization the following is also noted: as long as the magnetic dipole is in the horizontal plane, there is no preferred direction. When the particle density is sufficiently great, there can be a mutual influence such that the magnetic dipole orientations align in one direction within the horizontal plane. One can take account of this in design or operation.

The particular particle shapes shown in FIG. 16 are presented by way of illustration of the concept only, and in further examples the particles may have any desired shape without diminishing the claimed effects of the described examples.

The changes in exhibited magnetization may be measured by means of a provided magnetic field sensor. This may, by way of non-limiting example, be a conductive winding (such as in a magnetic recording head), or for instance a Hall sensor or magneto-resistive sensor. Other state of the art magnetic sensors suitable for measuring the magnetic field strength will be immediately apparent to the skilled person.

The magnetic field sensor may be operatively coupled with a controller operable to determine, based on the detected field strengths, values of, or in changes in, a thickness 16 of the actuator member 12. The thickness changes may be determined, in examples, by means of a pre-determined lookup table stored within a local memory of the controller, or accessible to the controller, storing actuator member thickness values correlated with each of a set of measured magnetic field strengths. These values may for example be derived experimentally for each particular actuator member, or may be standard values known to pertain to all actuator members of a particular specification. Thickness change values might alternatively be determined by the controller based on a known theoretical relation.

As in the above examples, the determined changes in the thickness of the actuator member may in examples be used to provide displacement feedback for controlling the actuator 12. In examples, a control loop might be established, wherein the thickness measurements provide direct or indirect feedback to inform the controller in controlling the electrical stimulation of the actuator member.

As in the previously described embodiment, the measured magnetic field strength depends upon a number of factors including a distance between the magnetic particles and the magnetic field sensor. This distance may change as a function of applied field voltage (or current) in the case that the actuator member is adapted to bend upon electrical stimulation. The controller may in examples be adapted to compensate for such voltage dependent field-strength changes, for example in accordance with the methods described in relation to the previous example.

Also as discussed in relation to the previous example, determined thickness changes may be utilized by the controller in informing control of the deformation of the actuator member. The determined thickness changes may be used for instance as part of a feedback loop in controlling the actuation behavior of the actuator (as described above).

As discussed above, magnetostrictive particles may be particles of either a hard or soft magnetic material. Accordingly, the presently described set of examples may, in particular cases, be combined or incorporated with any above described embodiments of the invention or further examples outlined above.

In accordance with any of the present examples, sensing of changes in shape of the actuator member may be performed simultaneously with stimulating deformation of the actuator member by either electrical stimulation or magnetic stimulation. For simultaneously magnetic sensing and magnetically stimulated deformation, determination of shape (e.g. thickness) changes may require compensating for the known magnetic field being actively applied across the actuator member.

For instance, in the case of dispersed hard magnetic particles, any measured magnetic field strength across the actuator member may typically include the magnetic field being applied for stimulating deformation. To monitor shape change (through monitoring changes in exhibited magnetic field strength across the member—as described in examples above), it is necessary only to subtract or otherwise eliminate from the measured field strength the magnitude of the known actively applied magnetic field. A similar compensation scheme can also be applied in the case of measuring shape changes in actuator members having embedded soft magnetic or magnetostrictive particles.

In accordance with any of the present examples, determination of a change in shape (e.g. thickness) of the actuator member caused by stimulating actuation of the member (either electrically or magnetically) may be achievable. This may be achieved in particular by determining an indication of the shape of the member in advance of actuation, and subsequently determining an indication of a shape after actuation of the member. As discussed above, lookup tables or calculation methods may be used to determine, based upon detected magnetic field strengths before and after actuation, an indication of a shape of the actuator member (e.g. an indication of a thickness, height or width). By comparing these two values (e.g. subtracting one from the other), an indication of a change in shape can be achieved.

Although in the detailed description herein above, the construction and operation of devices and systems according to the invention have been described for EAPs, the invention can in fact be used for devices based on other kinds of EAM (electro-active material). Hence, unless indicated otherwise, the EAP materials hereinabove can be replaced with other EAM materials. Such other EAM materials are known in the art and the person skilled in the art will know where to find them and how to apply them. A number of options will be described herein below.

Field driven EAMs can be organic or inorganic materials and if organic can be single molecule, oligomeric or polymeric. They are generally piezoelectric and possibly ferroelectric and thus comprise a spontaneous permanent polarization (dipole moment). Alternatively, they are electrostrictive and thus comprise only a polarization (dipole moment) when driven, but not when not driven. Alternatively they are dielectric relaxor materials. Such polymers include, but are not limited to, the sub-classes: piezoelectric polymers, ferroelectric polymers, electrostrictive polymers, relaxor ferroelectric polymers (such as PVDF based relaxor polymers or polyurethanes), dielectric elastomers, liquid crystal elastomers. Other examples include electrostrictive graft polymers, electrostrictive paper, electrets, electroviscoelastic elastomers and liquid crystal elastomers.

The lack of a spontaneous polarization means that electrostrictive polymers display little or no hysteretic loss even at very high frequencies of operation. The advantages are however gained at the expense of temperature stability. Relaxors operate best in situations where the temperature can be stabilized to within approximately 10° C. This may seem extremely limiting at first glance, but given that electrostrictors excel at high frequencies and very low driving fields, then the applications tend to be in specialized micro actuators. Temperature stabilization of such small devices is relatively simple and often presents only a minor problem in the overall design and development process.

Relaxor ferroelectric materials can have an electrostrictive constant that is high enough for good practical use, i.e. advantageous for simultaneous sensing and actuation functions. Relaxor ferroelectric materials are non-ferroelectric when zero driving field (i.e. voltage) is applied to them, but become ferroelectric during driving. Hence there is no electromechanical coupling present in the material at non-driving. The electromechanical coupling becomes non-zero when a drive signal is applied and can be measured through applying the small amplitude high frequency signal on top of the drive signal, in accordance with the procedures described above. Relaxor ferroelectric materials, moreover, benefit from a unique combination of high electromechanical coupling at non-zero drive signal and good actuation characteristics.

The most commonly used examples of inorganic relaxor ferroelectric materials are: lead magnesium niobate (PMN), lead magnesium niobate-lead titanate (PMN-PT) and lead lanthanum zirconate titanate (PLZT). But others are known in the art.

PVDF based relaxor ferroelectric based polymers show spontaneous electric polarization and they can be pre-strained for improved performance in the strained direction. They can be any one chosen from the group of materials herein below.

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The current driven EAMs and EAPs comprise conjugated polymers, Ionic Polymer Metal Composites, ionic gels and polymer gels.

Examples of ionic-driven EAPs are conjugated polymers, carbon nanotube (CNT) polymer composites and Ionic Polymer Metal Composites (IPMC).

The sub-class dielectric elastomers includes, but is not limited to: acrylates, polyurethanes, silicones.

The sub-class conjugated polymers includes, but is not limited to: polypyrrole, poly-3,4-ethylenedioxythiophene, poly(p-phenylene sulfide), polyanilines.

The materials above can be implanted as pure materials or as materials suspended in matrix materials. Matrix materials can comprise polymers.

To any actuation structure comprising EAM material, additional passive layers may be provided for influencing the behavior of the EAM layer in response to an applied drive signal.

The actuation arrangement or structure of an EAP device can have one or more electrodes for providing the control signal or drive signal to at least a part of the electroactive material. Preferably the arrangement comprises two electrodes. The EAP may be sandwiched between two or more electrodes. This sandwiching is needed for an actuator arrangement that comprises an elastomeric dielectric material, as its actuation is among others due to compressive force exerted by the electrodes attracting each other due to a drive signal. The two or more electrodes can also be embedded in the elastomeric dielectric material. Electrodes may be patterned or non-patterned.

A substrate can be part of the actuation arrangement. It can be attached to the ensemble of EAP and electrodes between the electrodes or to one of the electrodes on the outside.

The electrodes may be stretchable so that they follow the deformation of the EAM material layer. This is especially advantageous for EAP materials. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:

PSS). Metalized polyester films may also be used, such as metalized polyethylene terephthalate (PET), for example using an aluminum coating.

Some arrangements may have electrode layers on each side of the electroactive material layer. It is also possible to provide an electrode layer on one side only for example using interdigitated comb electrodes.

The materials for the different layers will be selected for example taking account of the elastic moduli (Young's moduli) of the different layers.

Additional layers to those discussed above may be used to adapt the electrical or mechanical behavior of the device, such as additional polymer layers.

Examples above make use of composite materials which combine an electroactive material (in particular a polymer) and other particles (which will be termed generally as a "filler").

The way such composite materials can be manufactured will now be discussed as well as the effects on the physical and electrical properties of the electroactive material.

The example of dielectric elastomer electroactive materials will first be presented. These are sandwiched between two electrodes to create dielectric electroactive polymer actuators. Silicone rubbers are the main applied elastomer group. The deformation is the result of attractive forces between the positively and negatively charged electrodes.

Compounding of particles in silicones is widely used on an industrial scale. As an example ultrasound transducer lenses are made of silicone (PDMS, Polydimethylsiloxane) filled with iron and silicon oxide particles to increase acoustic impedance and wear resistance. PDMS (silicone) compounds containing rutile (TiO2) are widely used to increase the refractive index or to create white reflecting materials.

With respect to the performance of a dielectric electroactive polymer, compounding with non-conducting hard particles such as ceramics has two main significant effects. First, the stiffness of the material increases requiring larger forces to obtain the same strain levels. Another effect is that the dielectric constant of the composite changes (in general that of the filler will be higher than that of silicones, which is close to 3). Whether the strain effect depending on voltage is positive or negative depends on the dielectric constant of the particles and on particle size as more small particles have a larger effect on stiffness.

This is discussed in S. Somiya, "Handbook of Advanced Ceramics: Materials, Applications, Processing, and Properties," in Nonlinear Dielectricity of MLCCs, Waltham, Academic Press, 2013, p. 415. By way of example, adding particles increases the dielectric constant but also increases the stiffness.

Thus, compounding fillers into elastomers to influence the properties of a dielectric electroactive polymer is known.

Silicone elastomers are in general prepared by mixing two components. One of them contains a Pt or peroxide curing catalyst. The different components can be mixed in a high speed mixer. In the same process, the filler can be added or the filler may already be premixed in one or both components. The filler material is in general applied in a solvent which evaporates during processing. After or during mixing in a high speed mixer in general vacuum is applied to remove air (and or solvents) inclusions. After this the mixture can be casted and cured. Curing temperature and time depends on the polymer grade but is typically around 80° C. for 10 minutes. Most particles are compatible with silicones as long as they do not inactivate the catalyst (for instance sulphur containing materials). Peroxide curing silicones are less sensitive.

Silicones can be injection molded (liquid silicone rubbers, LSR). The two components are injected on a screw, after passing a (static) mixer, of the LSR injection molding machine. The filler particles may be pre-mixed in one or both components. The material is transported by a cold screw and injected into a hot mold where it cures fast depending on temperature. As the LSR has very low viscosity very thin sections can be realized. Typical curing temperatures are close to 180° C. and times around 30 seconds to one minute.

Besides casting and injection molding a number of other shaping technologies are available to produce silicon rubber compound components also in the form of thin films. Examples are extrusion (foils and profiles), rolling of foils, lamination and rolling of multilayers, doctor blade film casting, spin coating and screen printing.

The filling can be performed locally at the point of manufacture, for example by using multi shot injection molding (2 shot or overmolding), silicone dispensing and over casting or silicone additive manufacturing (i.e. 3D printing)

The example of piezoelectric polymer composites will next be presented.

Piezo electric polymer composites containing a compound of PVDF (a matrix polymer) and ceramic particles such as PZT have been investigated. Manufacturing technologies like solvent casting and spin coating are suitable. Also, cold and hot pressing techniques are suitable. After dissolving the PVDF, evaporation of solvent until a viscous mix is obtained and mixing in the filler particles may then be performed. PVDF polymer based composites with a well dispersed grain size distribution and intact polymer matrix may be realized.

The example of relaxor electrostrictive polymer actuators will next be presented.

These are a class of semicrystalline terpolymers that can deliver a relatively high force with medium strain. Therefore these actuators have a wide range of potential applications. Relaxor electrostrictive polymers have been developed from "normal" PVDF polymers by employing proper defect modifications. They contain: vinylidene fluoride (VDF), trifluoroethylene (TrFE), and 1, 1-chlorofluoroethylene (CFE) or Chlorotrifluoro ethylene (CTFE).

Addition of defects in the form of chemical monomers, like 1,1-chlorofluoroethylene (CFE) which are copolymerised with the VDF-TrFE, eliminate the normal ferroelectric phase, leading to a relaxor ferroelectric with electromechanical strain greater than 7% and an elastic energy density of 0.7 J/cm3 at 150 MV/m. Furthermore it has been described that by introducing defects via high electron irradiation of the P(VDF-TrFE) copolymers, the copolymer can also be converted from a "normal" ferroelectric P(VDFTrFE) into a ferroelectric relaxor.

The materials may be formed by polymer synthesis as described in F. Carpi and et.al, "Dielectric Elastomers as Electromechanical Transducers: Fundamentals, Materials, Devices, Models and Applications of an Emerging Electroactive Polymer Technology," Oxford, Elsevier, 2011, p. 53. This discloses a combination of a suspension polymerization process and an oxygen-activated initiator. These films can be formed by pouring the solution on a glass substrate and then evaporating the solvent.

The desired filler can be added to the solvent before film casting. After casting, the composite can then be annealed to remove the solvent and increase crystallinity. The crystallization rate can reduce depending on filler concentration and particle size distribution. Stretching will align molecule chains and will become more difficult as particles can pin molecular chains. The dielectric constant will increase for most additives which reduces the required actuation voltage to reach a certain strain. The material stiffness will increase reducing strain.

The manufacturing process thus involves forming a polymer solution, adding particles, mixing, followed by casting (e.g. tape casting) potentially combined with lamination. Alternatives are spin coating, pressing etc.

Local variations in concentration can be realized using dispensing and/or 3D solvent printing. Layer thicknesses between 10 to 20 μm are for example possible with 3D printing processes.

In all examples, the addition of the filler generally has an effect on the breakdown voltage. The maximum strain that can be reached with an electroactive polymer is determined by the maximum voltage that can be applied, which is the breakdown voltage (or dielectric strength).

The breakdown voltage of polymers is related to the dissociation of polymer molecules under an applied external field. The addition of filler particles in a polymer matrix can have a significant influence on the breakdown voltage. Especially larger particles can locally increase fields. Therefore compounding polymers with particles in the sub-micron range has a lower negative effect on voltage breakdown. Furthermore the polymer-filler interface structure can strongly influence voltage breakdown.

Agglomeration of particles is another effect that reduces breakdown voltage. However, by modifying particle surfaces, preventing agglomeration and improving the interface structure, the negative effect of voltage breakdown levels can be reduced. However, the filled polymers will obtain lower breakdown strength then unfilled polymers, leading to lower actuation strain.

In conclusion, for dielectric electroactive polymers, compounding with particles can be achieved using a wide range of industrial compounding and shaping technologies. In order to keep the effect on stiffness and therefore stroke reduction for an actuator limited, smaller concentrations are preferred. For a given volume concentration, not too small particles are also preferred to keep the effect on stiffness limited. A soft base polymer can be selected to compensate for the rise in stiffness. Increased dielectric constant can enable actuation at reduced voltages. In order to maintain the dielectric strength, particle size and concentration should be limited and measures can be taken to improve the polymer-filler interface as well as particle dispersion. Local concentration variations can be printed.

For relaxor type electroactive polymers, compounding with particles is also possible. Similar trends with respect to the influence of particle concentration and size, on stiffness and dielectric strength are comparable to the effects described above. Particles can be added after polymerization. Dissolved polymers can be shaped using various technologies such as tape casting and spincoating. Also local concentration variations are possible.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Any reference signs in the claims should not be construed as limiting the scope.

The invention claimed is:

1. An actuator device, comprising:
    an actuator member, the actuator member comprising:
        an electroactive material, wherein the electroactive material is arranged to deform in response to application of an electrical stimulus; and
        particles of a soft magnetic material dispersed within the electroactive material;
    a magnetic field generation circuit,
        wherein the magnetic field generation circuit is arranged to generate a magnetic field of a configurable field strength pattern, and
        wherein the configurable field strength pattern is applied to the actuator member;
    an electrical stimulus generation circuit, wherein the electrical stimulus is created by the electrical stimulus generation circuit; and
    a controller circuit,
        wherein the controller circuit is arranged to control the magnetic field generation circuit and the electrical stimulus generation circuit in a coordinated manner, and
        wherein the control of the magnetic field generation circuit and the electrical stimulus generation circuit realizes one or more deformation patterns in the actuator member.

2. The actuator device as claimed in claim 1,
    wherein the magnetic field generation circuit is arranged to generate a magnetic field of non-uniform field strength such that the magnetic field of non-uniform field strength is applied across the actuator member.

3. The actuator device as claimed in claim 1, wherein the coordinated manner comprises activating the magnetic field generation circuit and the electrical stimulus generation circuit simultaneously.

4. The actuator device as claimed in claim 1, wherein the coordinated manner comprises activating the magnetic field generation circuit and the electrical stimulus generation circuit sequentially.

5. The actuator device as claimed in claim 1,
    wherein the controller circuit is arranged to execute a pre-determined control schedule,
    wherein the pre-determined control schedule is arranged to control deformation of the actuator member, and
    wherein the pre-determined control schedule comprises steps for controlling both the electrical stimulus generation circuit and the magnetic field generation circuit.

6. The actuator device as claimed in claim 1, wherein the particles of the soft magnetic material comprise at least one of a soft ferromagnetic material, a paramagnetic material, and a superparamagnetic material.

7. The actuator device as claimed in claim 1, wherein the soft magnetic material is a magnetostrictive material, and wherein the soft magnetic material is arranged to realize a contraction or expansion of the actuator member in response to application of a magnetic field by the magnetic field generation circuit.

8. The actuator device as claimed in claim 7, wherein the magnetic field generation circuit is arranged to generate a magnetic field of uniform field strength for application across the actuator member.

9. The actuator device as claimed in claim 1, wherein the magnetic field generation circuit is arranged to generate a magnetic field of non-uniform field strength for application across the actuator member.

10. The actuator device as claimed in claim 9,
wherein the controller circuit is arranged to induce a bending in at least a portion of the actuator member,
wherein the bending is in a given direction, and
wherein the controller circuit is arranged to control the magnetic field generation circuit to generate a magnetic field of non-uniform magnetic field strength such that the magnetic field of non-uniform magnetic field strength has magnetic field lines extending through the actuator member in a direction antiparallel to the given bending direction.

11. The actuator device as claimed in claim 1,
wherein the particles are suspended in polymer droplets within the electroactive material, and
wherein the polymer droplets have a viscosity lower than that of the electroactive material.

12. The actuator device as claimed in claim 1, wherein the particles of the soft magnetic material are dispersed non-homogenously in the actuator member, so as to achieve non-uniform deformation patterns.

13. The actuator device as claimed in claim 12, wherein the particles of the soft magnetic material are arranged in a set of spatially discrete concentrations within the actuator member.

14. The actuator device as claimed in claim 13, wherein the magnetic field generating circuit is arranged to generate a magnetic field having different magnetic field strengths across each of the set of spatially discrete concentrations.

15. The actuator device as claimed in claim 5, wherein the pre-determined control schedule includes steps dependent upon one or more input parameters.

* * * * *